(12) United States Patent
Takayama et al.

(10) Patent No.: US 7,105,448 B2
(45) Date of Patent: Sep. 12, 2006

(54) METHOD FOR PEELING OFF SEMICONDUCTOR ELEMENT AND METHOD FOR MANUFACTURING SEMICONDUCTOR DEVICE

(75) Inventors: Toru Takayama, Atsugi (JP); Yasuyuki Arai, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 360 days.

(21) Appl. No.: 10/787,165

(22) Filed: Feb. 27, 2004

(65) Prior Publication Data
US 2004/0171262 A1    Sep. 2, 2004

(30) Foreign Application Priority Data
Feb. 28, 2003  (JP) ............................... 2003-052139
Feb. 28, 2003  (JP) ............................... 2003-052940

(51) Int. Cl.
*H01L 21/302* (2006.01)
(52) U.S. Cl. ......................... 438/690; 438/39; 438/42; 438/421; 438/694; 438/697; 438/455; 438/458
(58) Field of Classification Search .................. 438/39, 438/42, 421, 694, 690, 697, 960, 455, 458; 216/38, 39, 56
See application file for complete search history.

(56) References Cited

U.S. PATENT DOCUMENTS 6,107,213 A *   8/2000  Tayanaka ..................... 438/762
6,339,010 B1    1/2002  Sameshima
6,624,047 B1 *  9/2003  Sakaguchi et al. .......... 438/458
6,900,114 B1 *  5/2005  Ohmi et al. ................. 438/455
2001/0012677 A1  8/2001  Sameshima
2004/0266137 A1* 12/2004  Huang et al. ............... 438/458
2005/0059219 A1*  3/2005  Tayanaka .................... 438/458

FOREIGN PATENT DOCUMENTS

| JP | 10-079330 |   | 3/1998 |
| JP | 11-097357 |   | 4/1999 |
| JP | 2001-176813 | * | 6/2001 |
| JP | 2001-223165 |   | 8/2001 |

* cited by examiner

*Primary Examiner*—George A. Goudreau
(74) *Attorney, Agent, or Firm*—Eric J. Robinson; Robinson Intellectual Property Law Office, P.C.

(57) ABSTRACT

A method for peeling off a thin film semiconductor element over an insulating surface by using a void, and a method for manufacturing a semiconductor device by transferring the peeled semiconductor element. According to the peeling method of the invention, a first base layer having a plurality of recessed portions is formed over a substrate, and a second base layer having a plurality of voids is formed on the recessed portions of the first base layer. On the second base layer, a third base layer is formed and a semiconductor element is formed thereon. Then, by separating the second base layer at an intersecting surface with the voids, the semiconductor element is peeled off from the substrate.

41 Claims, 14 Drawing Sheets

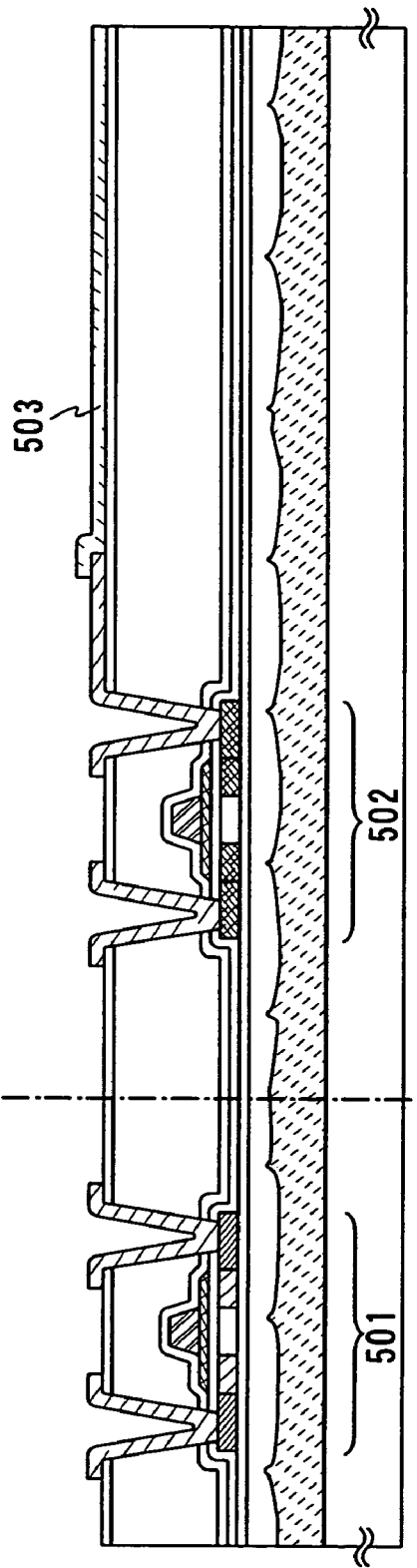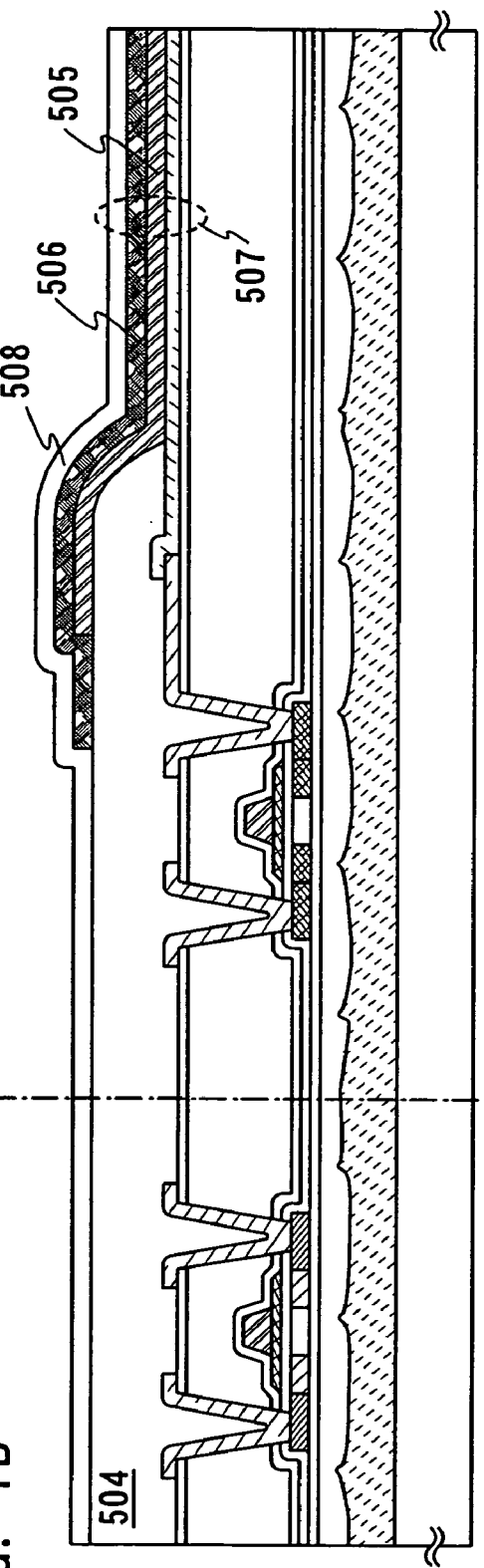

US 7,105,448 B2

METHOD FOR PEELING OFF SEMICONDUCTOR ELEMENT AND METHOD FOR MANUFACTURING SEMICONDUCTOR DEVICE

BACKGROUND OF THE INVENTION

1. Field of the Invention

The present invention relates to a method for peeling off a semiconductor element formed on an insulating surface and to a method for manufacturing a semiconductor device by using the peeling method.

2. Description of the Related Art

Portable electronic equipment typified by a mobile phone, an electronic notebook and the like require multiple functions such as sending and receiving e-mail, voice recognition, taking-in images by a small camera as well as a flat panel display for displaying images. On the other hand, reduction in size and weight of the portable electronic equipment is still sought for satisfying the user needs. Therefore, as many ICs having larger circuit scale and memory capacity as possible are required to be mounted on the narrow space of the portable electronic equipment. It is an essential part to make a flat panel display to be mounted as thin and light as possible in order to achieve the reduction in size and weight of the portable electronic equipment while making space for mounting ICs. Reducing the thickness of a glass substrate used for forming a display panel is likely to be the most effective means of reducing the thickness and weight of the portable electronic equipment. However, there is a limit in reducing the thickness of a glass substrate when the mechanical strength of the display panel is considered. For instance, in the case where barium borosilicate glass, aluminum borosilicate glass and the like are utilized, a 3 inch square panel has a thickness of approximately 1 to 2 mm and a weight of approximately 10 g at least.

In view of the foregoing, a flat panel display using a plastic substrate instead of a glass substrate has been actively researched and developed. A plastic substrate having flexibility exhibits an excellent resistance to vibration and shock as compared with a glass substrate. In addition, a plastic substrate can be easily reduced in thickness and the material itself is light. Therefore, a plastic substrate is considered to be effective for forming a thin and light flat panel display. However, in many cases, the heat resistance of a plastic substrate is not high enough to withstand a heat treatment during manufacturing steps of a semiconductor element. Thus, a manufacturing method of a semiconductor element is suggested in which another substrate having a high heat resistance is prepared and a semiconductor element is formed thereon, then the semiconductor element is peeled off from the substrate and attached on a plastic substrate. A specific method of the peel-off varies according to manufacturers and each manufacturer exercises its ingenuity in their peeling method.

In Patent Document 1 (Patent Document 1: Japanese Patent Laid-Open No. 2001-223165), a manufacturing method of nitride semiconductor is disclosed. According to this manufacturing method, after a porous GaN layer having a lot of fine voids on the surface is formed on a substrate by photo etching, a GaN epi layer is formed on the porous GaN layer by epitaxial growth. Then, the porous GaN layer having voids is dissolved and fractured by selective etching, high-pressure water, GaAs jet, laser and the like so that the GaN epi layer is peeled off from the substrate and attached to another substrate.

According to the peeling method disclosed in Patent Document 1, before forming a semiconductor layer, voids are formed between a substrate and the semiconductor layer. Hence, after forming the semiconductor layer, a heat treatment, an irradiation of laser beam and the like do not have to be performed on the semiconductor layer with the intention of facilitating the peel-off. Thus, the peeling method above has the advantage that the semiconductor layer is not damaged and the stress within the semiconductor layer can be reduced due to the voids.

However, since the voids are formed by photo etching according to the peeling method disclosed in Patent Document 1, there is a limit in making larger voids. Therefore, it is not possible to appropriately enlarge the voids in order to reduce the time required for dissolution and fracture of a layer on which the voids are formed or to reduce the stress of a semiconductor layer when peeled off. Moreover, although a peeling method of a single crystalline semiconductor layer is disclosed in Patent Document 1, there is no specific description of a peeling method of a thin film semiconductor element on an insulating surface by the use of voids.

In view of the foregoing, it is a general object of the invention to provide a peeling method of a thin film semiconductor element on an insulating surface by the use of voids, and it is another object of the invention to provide a manufacturing method of a semiconductor device by transferring the peeled semiconductor element.

SUMMARY OF THE INVENTION

According to the invention, a first base layer having recessed portions and projective portions is formed on a substrate and a second base layer is formed thereon. The form of the recessed portions of the first base layer is determined so that voids are formed inside the second base layer at least on the recessed portions of the first base layer. The narrower and deeper opening portions of the recessed portions are, the voids can be formed easier and the voids occupy more volume in the recessed portions.

The form and volume of the voids as well as the form of the recessed portions vary depending on a deposition method of the second base layer. When the step coverage for an insulating layer to be deposited is excellent in the recessed portions, the volume occupied by the voids in the recessed portions can be made smaller. On the other hand, with the worse step coverage for the insulating layer, the volume occupied by the voids in the recessed portions can be made larger. Specifically, the second base layer including the voids can be obtained by sputtering, coating, or by CVD and the like in accordance with the condition.

With reference to FIGS. 1A to 1D, forming steps of the second base layer including voids are described. First, as shown in FIG. 1A, a first base layer 100 having recessed portions and projective portions is formed. How to form the recessed portions and projective portions of the first base layer will be described afterward in Embodiment Mode 2. Reference numeral 100a denotes a recessed portion and 100b denotes a projective portion. Surfaces of the recessed portion 100a and the projective portion 100b are kept almost horizontal. In the case of forming a second base layer 101 by sputtering, for example, the second base layer 101 is formed on the projective portion 100b and on the bottom of the recessed portion 100a by priority early in the deposition as shown in FIG. 1A.

When the deposition of the second base layer 101 is proceeded, the state is changed from that shown in FIG. 1A to that shown in FIG. 1B. As shown in FIG. 1B, the second base layer 101 is formed so as to be thicker in an edge and vicinity 102 of the projective portion 100b. This is caused by the tendency of material molecules composing the second base layer 101, which move toward a stable cite on a surface to be deposited and which are easy to gather into the edge and vicinity 102 of the projective portion 100b.

The deposition speed is lower inside the recessed portion 100a than in the edge and vicinity 102 of the projective portion 100b. Therefore, when the deposition of the second base layer 101 is further proceeded, a layer formed in the edge and vicinity 102 is made still thicker to end up covering the recessed portion 100a. Then, a void 103 is formed inside the second base layer 101 on the recessed portion 100a.

The form and volume of the void 103 varies depending on the form of the recessed portion 100a and the deposition method. FIG. 1D is a top view of a substrate, and for instance, FIG. 1C is assumed as a cross sectional view of FIG. 1D along a line A–A'. In FIG. 1D, the recessed portions 100a are arranged in striped pattern. In this case, the void 103 is formed so as to extend in the longitudinal direction of the recessed portion 100a.

A thin film semiconductor layer is formed on the second base layer 101 formed in such a manner, and a semiconductor element is formed thereon. Then, the second base layer 101 which includes the voids 103 is dissolved or broken to be separated, thus the semiconductor element is peeled off and transferred to another substrate. The peel-off at this time may be conducted physically, or by selective etching, fracturing by means of high-pressure water or laser. According to the invention, the peel-off by the use of the void may also be performed by wet etching. In this case, a thin film semiconductor layer is formed on the second base layer 101 obtained in a manner shown in FIGS. 1A to 1D, and a semiconductor element is formed thereon, then an opening portion which extends to a part of the void 103 is provided. An etchant is diffused from the opening portion into the void 103 so as to etch the inner wall of the void and expand it. At the end, the second base layer 101 is separated at an intersecting surface with a plurality of voids so that the semiconductor element is peeled off. Afterwards, the peeled semiconductor element is transferred to a substrate prepared separately. The peel-off may be conducted only by etching or physical forces may be applied after etching.

When the peel-off is conducted, it is not necessary to irradiate laser beam directly to the semiconductor element, and either to perform heat treatment which adversely affects the properties of the semiconductor element. Accordingly, the semiconductor layer can be kept with little deterioration. Internal stresses of the second base layer and the semiconductor layer can be lowered due to the voids, and stress migration during manufacturing steps of the semiconductor element can also be improved.

According to the invention, by using an insulating layer having recessed portions and projective portions, the size, form and layout of a void can be easily optimized, and physical forces required for peeling off or processing time required for facilitating the peel-off can be reduced. Thus, the semiconductor element can be peeled off with little deterioration. In addition, by using an insulating layer having recessed portions and projective portions, the size, form and layout of a void can be easily optimized for etching. Further, physical forces required for peeling off as well as processing time required for facilitating the peel-off can be reduced. Thus, the semiconductor element can be peeled off with little deterioration.

As described above, by using an insulating layer having recessed portions and projective portions, the size, form and layout of a void can be easily optimized, and physical forces required for peeling off or processing time required for facilitating the peel-off can be reduced, hence the semiconductor element can be peeled off with little deterioration. Moreover, by using an insulating layer having recessed portions and projective portions, which enables to optimize the size, form and layout of a void, an etchant can be effectively diffused inside the void and the inner wall of the void can be enlarged. Accordingly, processing time required for etching can be reduced. In the case where the semiconductor element is physically peeled off after etching, the physical forces required for the peel-off can also be reduced, and thus the semiconductor element can be peeled off with little deterioration. Further, according to the invention, when the peel-off is performed, it is not necessary to irradiate laser beam directly to the semiconductor element, nor to perform heat treatment which adversely affects the properties of the semiconductor element. Therefore, a semiconductor layer can be kept with little deterioration. In addition, internal stresses of the second base layer and the semiconductor layer can be lowered due to the void, and stress migration during manufacturing steps of the semiconductor element can also be improved.

These and other objects, features and advantages of the present invention become more apparent upon reading of the following detailed description along with the accompanying drawings.

BRIEF DESCRIPTION OF THE DRAWINGS

FIGS. 7A and 7B show a manufacturing method of a display device by using the peeling method of the invention.

DETAILED DESCRIPTION OF THE INVENTION

EMBODIMENT MODE 1

Explanation is hereinafter made on a manufacturing method of a semiconductor device by using a peeling method according to the invention.

Figure 1A:
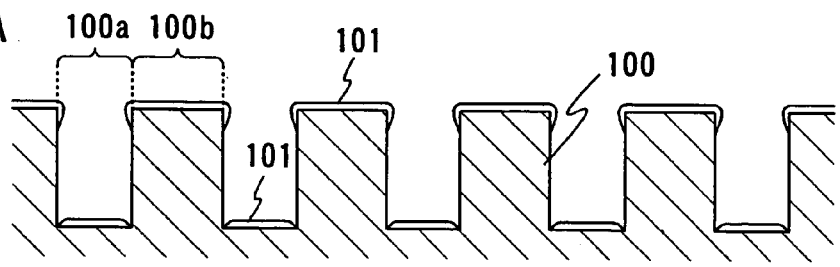
FIGS. 1A to 1D show manufacturing steps of a void used in a peeling method of the invention.
Figure 1B:
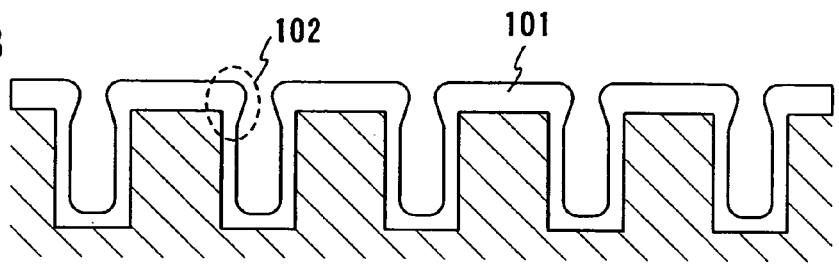
Figure 1C:
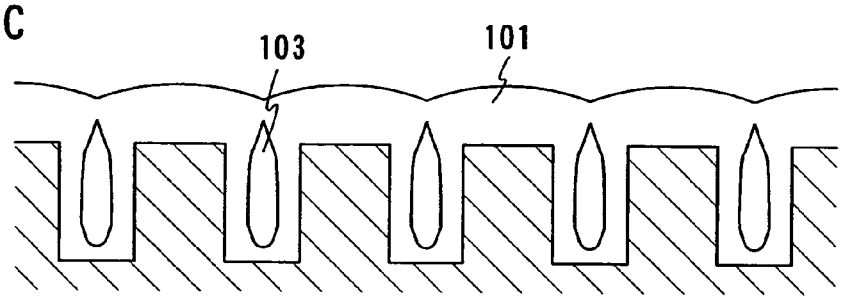
Figure 1D:
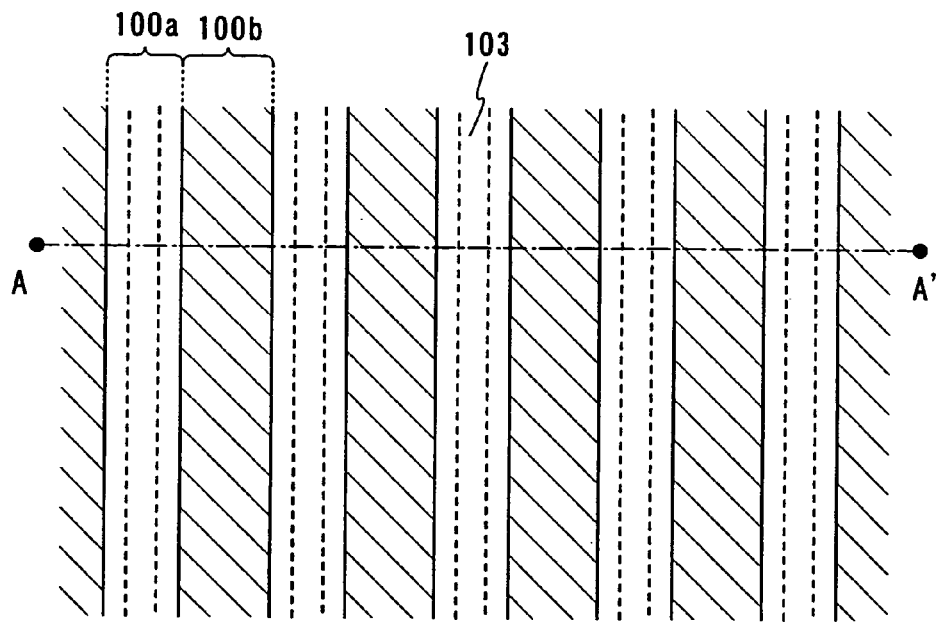
Figure 2A:
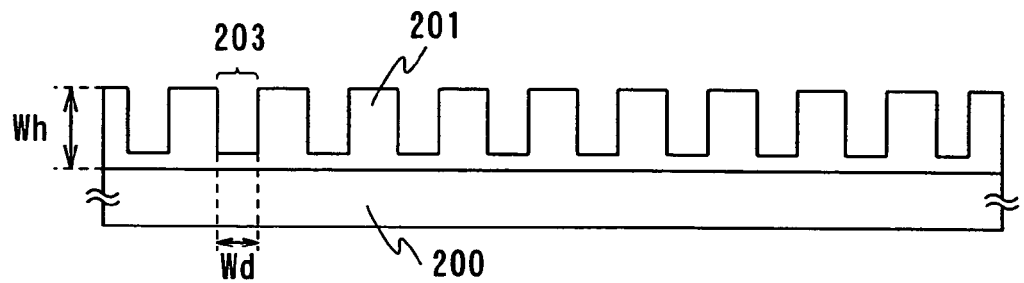
FIGS. 2A to 2D show the peeling method of the invention.

First, a first base layer 201 having recessed portions and projective portions is formed on a first substrate 200 as shown in FIG. 2A. The first substrate 200 can be formed of a material which is capable of withstanding a heat treatment in subsequent steps. For example a quartz substrate, a silicon substrate, a glass substrate such as of barium borosilicate glass or aluminum borosilicate glass, a metal substrate, stainless substrate and the like are available.

In this embodiment mode, a silicon oxide layer is used for the first base layer 201. However, a material for the first base layer 201 is not limited to this, and an insulating layer such as silicon nitride layer and silicon nitride oxide layer or a metal layer such as W and Mo may also be used. A method for forming the recessed portions and projective portions will be described in detail afterward. The first base layer 201 may be formed of a single layer, or a plurality of layers to be laminated. In the latter case, all the layers may be formed of either insulating layers or metal layers, or may have a laminated structure of insulating layers and metal layers.

The form of the recessed portions and projective portions can be appropriately determined by a designer in accordance with a deposition method and a peeling method. A recessed portion 203 is stripe shaped in this embodiment mode, and the width Wd which is perpendicular to the longitudinal direction of the recessed portion is 1 μm or less, and the depth Wh is 2 μm or more.

Figure 2B:
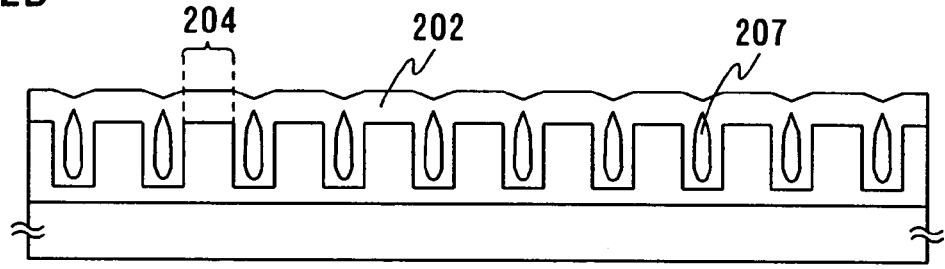

Next, a second base layer 202 is formed so as to cover the first base layer 201 as shown in FIG. 2B. The second base layer 202 can be formed by sputtering, coating, plasma CVD and the like. It is to be noted that the deposition method is not limited to these and other known deposition methods can be used as long as voids can be formed in the second base layer 202. The second base layer 202 is preferably formed of an insulating layer. Specifically, known insulating layers such as silicon oxide layer, silicon nitride layer, and silicon nitride oxide layer can be employed. For the second base layer 202, an insulating layer including a Si—O bond and a Si—CHx bond each formed of siloxane-based material may also be used. In this embodiment mode, a silicon oxide layer is deposited by RF sputtering to form the second base layer 202.

The deposition in this embodiment mode is performed by using a $SiO_2$ target having a diameter of 305 mm, at a substrate temperature of from 100 to 200° C., for instance 150° C., at an RF power of 3 kW, and in an Ar atmosphere at a pressure of 0.4 Pa. The flow rate of Ar is 60 sccm in total, and 10 sccm of it is heated and sprayed onto the backside of the substrate so as to prevent the substrate temperature from being changed. The deposition speed is in the range of 68 to 72 nm/min.

The second base layer 202 is formed so as to be thick enough to close an opening portion of the recessed portion 203 and form a void 207. Therefore, it is preferable to appropriately determine the thickness of the second base layer 202 in accordance with the form of the recessed portion 203 and the deposition method. In this embodiment mode, the second base layer 202 is formed so that the thickness on a projective portion 204 of the first base layer 201 is approximately 1 μm.

Figure 2C:
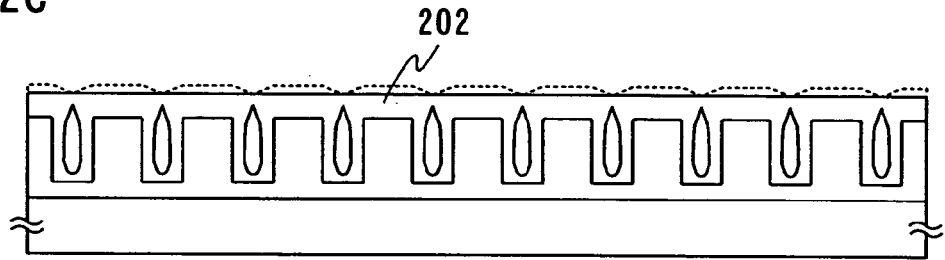

Shortly after the deposition, the surface of the second base layer 202 may have some unevenness due to the recessed portions and projective portions of the first base layer 201. Accordingly, the surface of the second base layer 202 may be polished so as not to adversely affect the properties of the semiconductor element to be formed later. In this embodiment mode, the surface of the second base layer 202 is polished by chemical mechanical polishing (CMP) for the planarization of the second base layer 202. A known CMP technique can be used here. Generally used in polishing an oxide layer is a solid-liquid dispersion system slurry obtained by dispersing a 100 to 1000 nmφ abrasive in a solution containing a reagent such as a pH adjuster. This embodiment mode uses a silica slurry (pH=10 to 11) in which 20 wt % of fumed silica particles obtained by pyrolizing silicon chloride gas are dispersed in a solution added with potassium hydroxide. It is to be noted that the polishing technique is not limited to CMP, but other polishing methods may be used as long as the planarization is achieved. After polished, the surface of the second base layer 202 is planarized as shown in FIG. 2C.

Figure 2D:
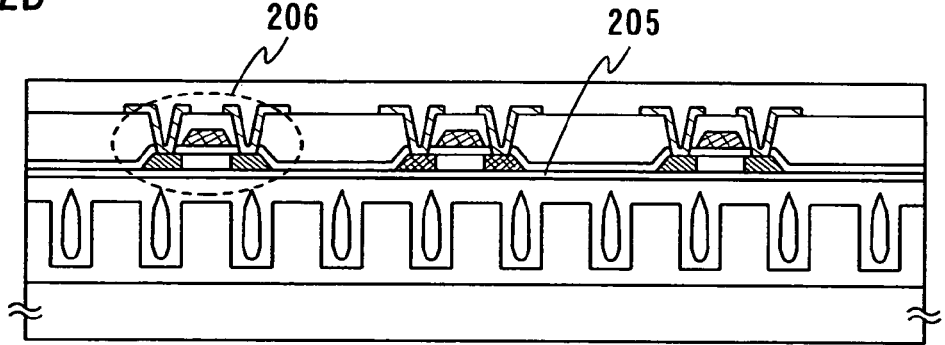

Subsequently, a third base layer 205 formed of an insulating layer is formed on the planarized second base layer 202. Then, a semiconductor element 206, that is a TFT herein, is formed on the third base layer 205 (FIG. 2D). The third base layer 205 has relatively lower etching rates as compared with the second base layer 202. According to this, when the second base layer 202 is separated at an intersecting surface with the void, the semiconductor element 206 can be protected by the third base layer 205. Further, the semiconductor element 206 to be peeled off is preferably covered with an interlayer insulating layer and the like so as to be protected.

A protective layer 212 is formed so as to cover the semiconductor element 206. The protective layer 212 is provided to prevent the semiconductor element 206 from being damaged in subsequent attaching and peeling steps of a second substrate 209. Therefore, a material which is removable after peeling off the second substrate 209 is used for the protective layer 212. For instance, epoxy resin, acrylate resin, or silicon resin which are soluble in water or alcohols is coated over the whole substrate and baked to obtain the protective layer 212. In this embodiment mode, a layer formed of water-soluble resin (a product of TOAGOSEI CO., Ltd.: VL-WSHL10) is spin-coated to have a thickness of 30 μm and exposed to light for two minutes so as to be partially cured, then, exposed its back to UV rays for 2.5 minutes and exposed its surface to UV rays for 10 minutes, for 12.5 minutes in total, so as to be fully cured. Thus, the protective layer 212 can be obtained (FIG. 3A).

It is to be noted that in the case of laminating a plurality of organic resins, there is a possibility that the plural organic resins are melted partially or are too adhesive when coated or baked, according to a solvent to be used. Therefore, when organic resin soluble in the same solvent is used for each of the interlayer insulating layer covering the semiconductor element 206 and the protective layer 212, an inorganic insulating layer (a $SiN_X$ layer, a $SiN_XO_Y$ layer, an $AlN_X$ layer, or an $AlN_XO_Y$ layer) is preferably formed between the insulating layer covering the semiconductor element 206 and the protective layer 212 formed later. Accordingly, the protective layer 212 can be easily removed in subsequent steps.

Figure 3A:
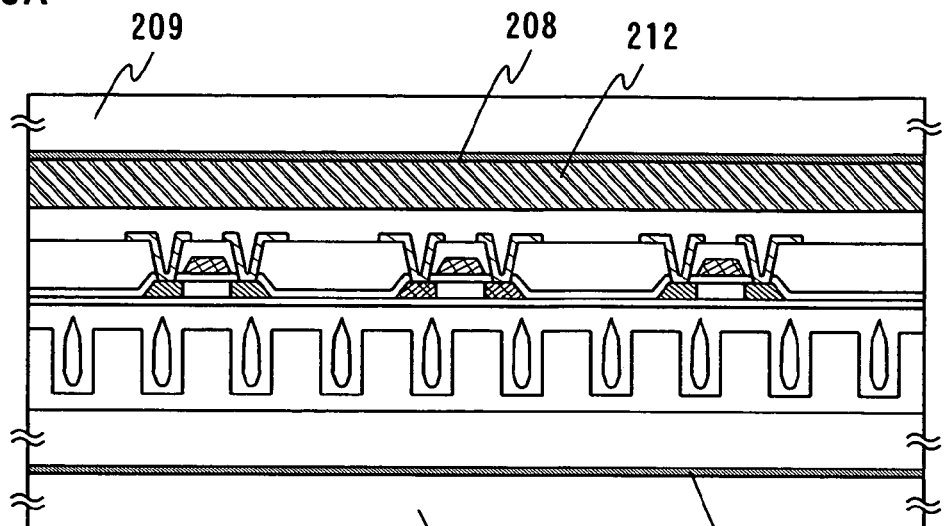
FIGS. 3A to 3C show the peeling method of the invention.

Next, the second substrate 209 is attached to the protective layer 212 with a two-sided tape 208, and a third substrate 211 is attached to the first substrate 200 with a two-sided tape 210 (FIG. 3A). Incidentally, the two-sided tapes 208 and 210 are not necessarily used for the attachment. Instead, other material such as an adhesive, which can be used for attachment of the second substrate 209 or the third substrate 211, may substitute for the two-sided tapes. When using an adhesive removable by UV rays, for example, the second substrate 209 can be peeled off while reducing damages of the semiconductor elements. The third substrate 211 prevents the first substrate 200 from being damaged in a subsequent peeling step. For the second substrate 209 and the third substrate 211, a substrate having as high rigidity as that of the first substrate 200 or higher rigidity than that of the first substrate 200, such as a quartz substrate or a semiconductor substrate, is preferably to be used.

It is to be noted that the second substrate 209 is not necessarily attached by making the protective layer 212 thicker. Further, when the first substrate 200 has enough rigidity to resist the peel-off, the third substrate 211 is not necessarily provided.

Next, preparatory step for the peel-off is conducted so that the second base layer 202 is partially separated at the void 207 into two sides: the first substrate 200 side and the second substrate 209 side. Specifically, the preparatory step for the peel-off is performed by locally applying pressure from outside on the region to be peeled off along with the periphery thereof so as to damage the second base layer 202 exposed at the edges of the first or second substrate and to bore the void 207. In this embodiment mode, a hard needle such as a diamond pen is pressed perpendicular to the edge and vicinity of the second base layer 202 and moved along with the second base layer 202 with applying pressure. Preferably, a scriber device may be used to move with applying pressure on the region with press force ranging from 0.1 to 2 mm. By performing such preparatory step for partially weakening the adhesiveness, deterioration in peeling off can be reduced and the production yield can be improved.

Figure 3B:
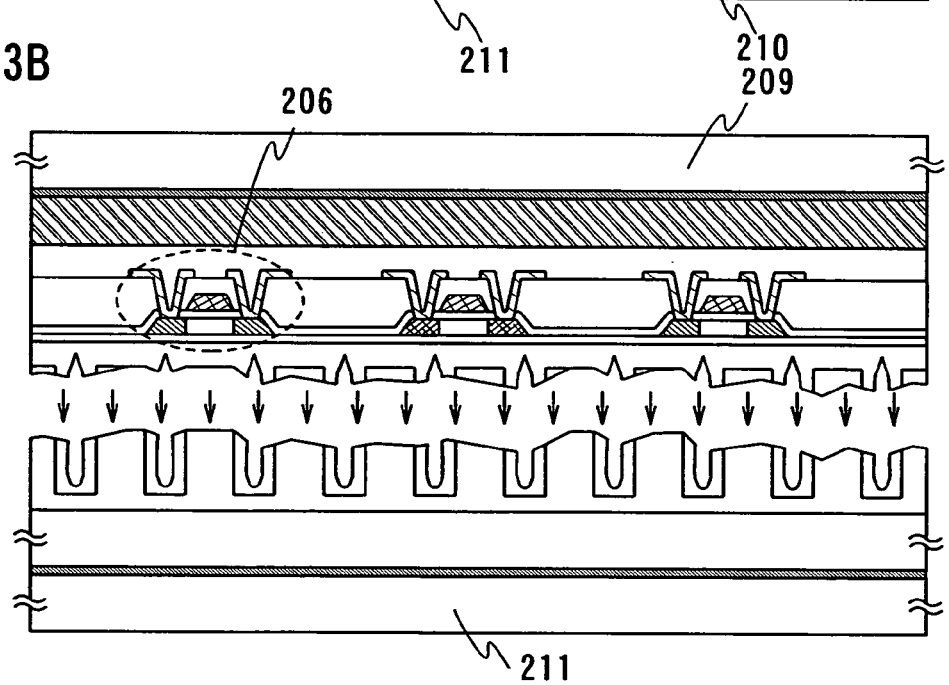

Then, the second base layer 202 is physically separated at the void 207 so that the first substrate 200 is peeled off from the second substrate 209 (FIG. 3B). The peel-off is started from the region in which the adhesiveness is partially weakened in the preceding step. According to this peel-off, the second base layer 202 is separated at an intersecting surface with the void 207 into the first substrate 200 side and the second substrate 209 side. The first base layer 201 may also be separated partially into the first substrate 200 side and the second substrate 209 side. As a result, the second substrate 209 attached with the semiconductor element 206 is separated from the third substrate 211 attached with the first substrate 200 and a part of the second base layer 202, and with a part of the first base layer 201 in some cases.

The peel-off can be performed by air pressure of gas sprayed from a nozzle, ultrasonic waves and the like. The peel-off may also be performed by fracturing the void 207 from the edge of the first or second substrate by laser irradiation or spraying water or other liquid, or also be performed by enlarging the void 207 by etching. A designer can determine the peeling method appropriately. However, for preventing the protective layer 212 from being dissolved, it is preferable to determine the peeling method in accordance with a material for the protective layer 212.

Figure 3C:
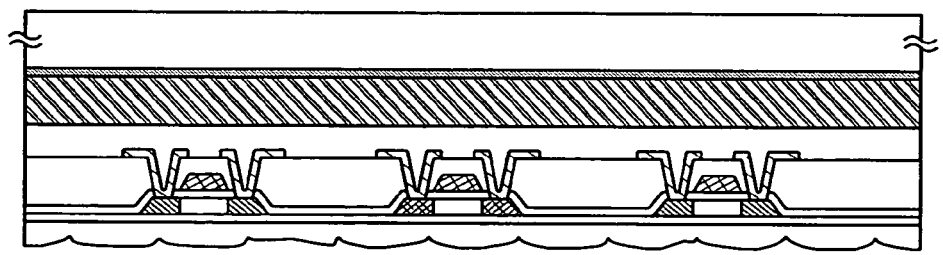

After the peel-off, a part of the second base layer 202 and a part of the first base layer 201 which are peeled off with the second substrate 209 may be partially or completely removed by etching (FIG. 3C).

Figure 4A:
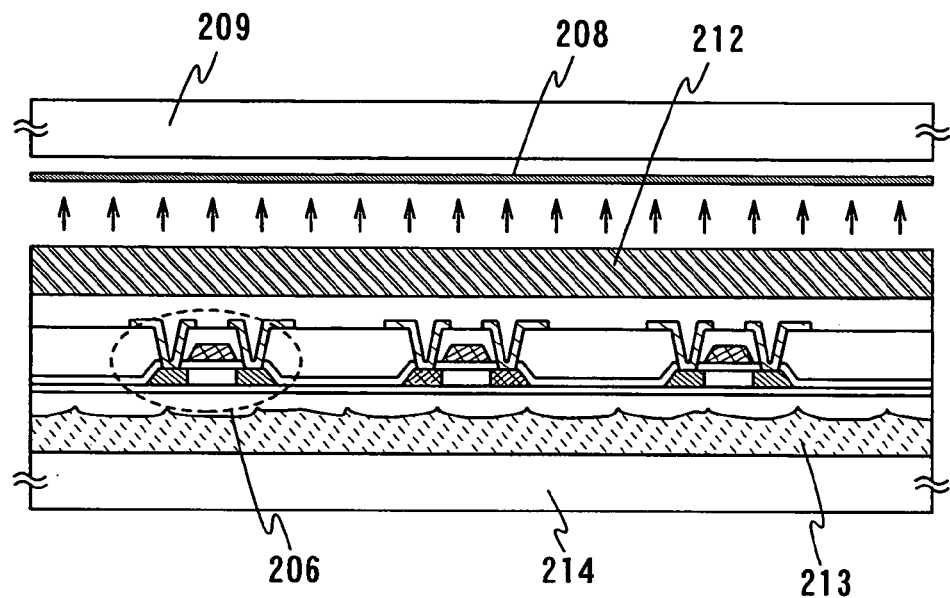
FIGS. 4A and 4B show the peeling method of the invention.

Then, with an adhesive 213, the semiconductor element 206 is attached to a substrate (element substrate) 214 on which the semiconductor element is transferred at the end. Specifically, a surface which is exposed by the peel-off is attached to the element substrate 214 with the adhesive 213 so as to attach the semiconductor element 206 (FIG. 4A). What is important in selecting a material for the adhesive 213 is that the adhesive strength of the element substrate 214 and the semiconductor element 206 with the adhesive 213 is higher than that of the second substrate 209 and the protective layer 212 with the two-sided tape 208.

For the adhesive 213, various types of curing adhesives, for example, a reaction-curing adhesive, a heat-curing adhesive, a photo-curing adhesive such as a UV-curing adhesive, or an anaerobic adhesive can be used. It is more preferable that the adhesive 213 contains powder composed of silver, nickel, aluminum, and aluminum nitride, or filler to have high thermal conductivity.

In this embodiment mode, a plastic substrate is used for the element substrate 214. A plastic substrate has the advantage that a semiconductor device can be reduced in thickness and weight. However, the element substrate used in the invention is not limited to this, and an interposer using a glass-epoxy material and the like or a substrate using other material can also be used.

For a plastic substrate, ARTON (a product of JSR) formed of norbornen resin with polar group can be used. A plastic substrate may also be formed of polyethylene terephthalate (PET), polyether sulfone (PES), polyethylene naphthalate (PEN), polycarbonate (PC), nylon, polyether ether ketone (PEEK), polysulfone (PSF), polyether imide (PEI), polyarylate (PAR), polybutylene terephthalate (PBT), polyimide, and the like.

As shown in FIG. 4A, the second substrate 209 and the two-sided tape 208 are separated in this order or at the same time from the protective layer 212. It is to be noted that in the case of using the UV-curing adhesive for the adhesive 213 and using a tape or an adhesive removable by UV rays for the two-sided tape 208, the peel-off of the two-sided tape 208 and the curing of the adhesive 213 can be performed at the same time.

Figure 4B:
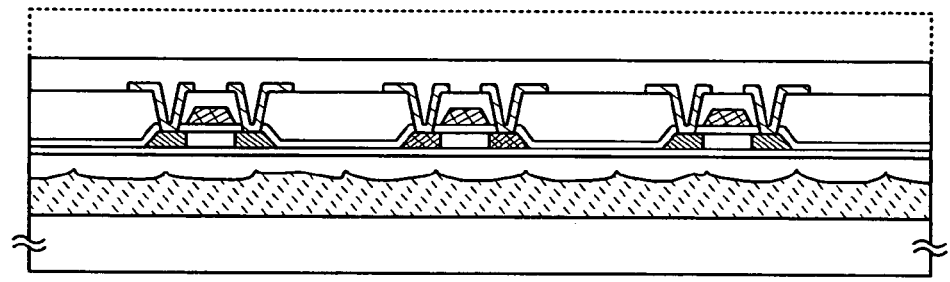

Subsequently, the protective layer 212 is removed as shown in FIG. 4B. Since a resin which is soluble in water is used herein, the protective layer 212 is dissolved in water to be removed. In the case where residue of the protective layer 212 causes the deterioration of the device, it is preferable that cleaning or treating in $O_2$ plasma is performed to remove the residue of the protective layer 212.

In such a manner, the transfer of the semiconductor element can be achieved. When a semiconductor element on the second layer is stacked with the intention of the three-dimensionalization of an integrated circuit, the semiconductor element on the second layer may be stacked in the same manner as the semiconductor element on the first layer. The distance between each layer can be controlled by adjusting the thickness of an adhesive used for attaching each layer. Each layer can be attached with an adhesive having a thickness of a few micrometers at least, though it depends on the pressure applied in attaching each layer.

In the case where a display device is formed by the transfer, a display element of the device is transferred before completing the display device. Specifically, when a liquid crystal display device is formed, a pixel electrode of a liquid crystal cell, which is electrically connected to a TFT which is a kind of semiconductor elements, and an alignment layer which covers the pixel electrode are formed and transferred. Then, a counter substrate prepared separately is attached and a liquid crystal is injected to complete the liquid crystal display device. A display device included in the semiconductor device of the invention is typified by a liquid crystal display device, a light emitting device having in each pixel a light emitting element such as an organic light emitting element (electro luminescence element), a DMD (Digital Micromirror Device) and the like. An integrated circuit included in the semiconductor device of the invention is typified by a microprocessor (CPU), a memory, a power supply circuit, and other digital circuits and analog circuits.

Transferring steps of a semiconductor element which is peeled off by the above-described method are not limited to the steps explained above.

According to the invention, a semiconductor element may be peeled off at the voids by wet etching as well.

When the peel-off is performed by wet etching, a silicon oxide layer is used for the first base layer 201. However, a material for the first base layer 201 is not limited to this and an insulating layer such as a silicon nitride layer and a silicon nitride oxide layer may also be used. The first base layer 201 may be formed of a single layer or a plurality of layers to be laminated. The form of the recessed portions and projective portions can be appropriately determined by a designer depending on a deposition method and etching conditions in peeling steps. In this embodiment mode, a recessed portion 203 is stripe shaped, and the width Wd which is perpendicular to the longitudinal direction of the recessed portion is 1 μm or less and the depth Wh is 2 μm or more. The protective layer 212 is formed without covering a region used for forming an opening portion afterward.

Figure 5A:
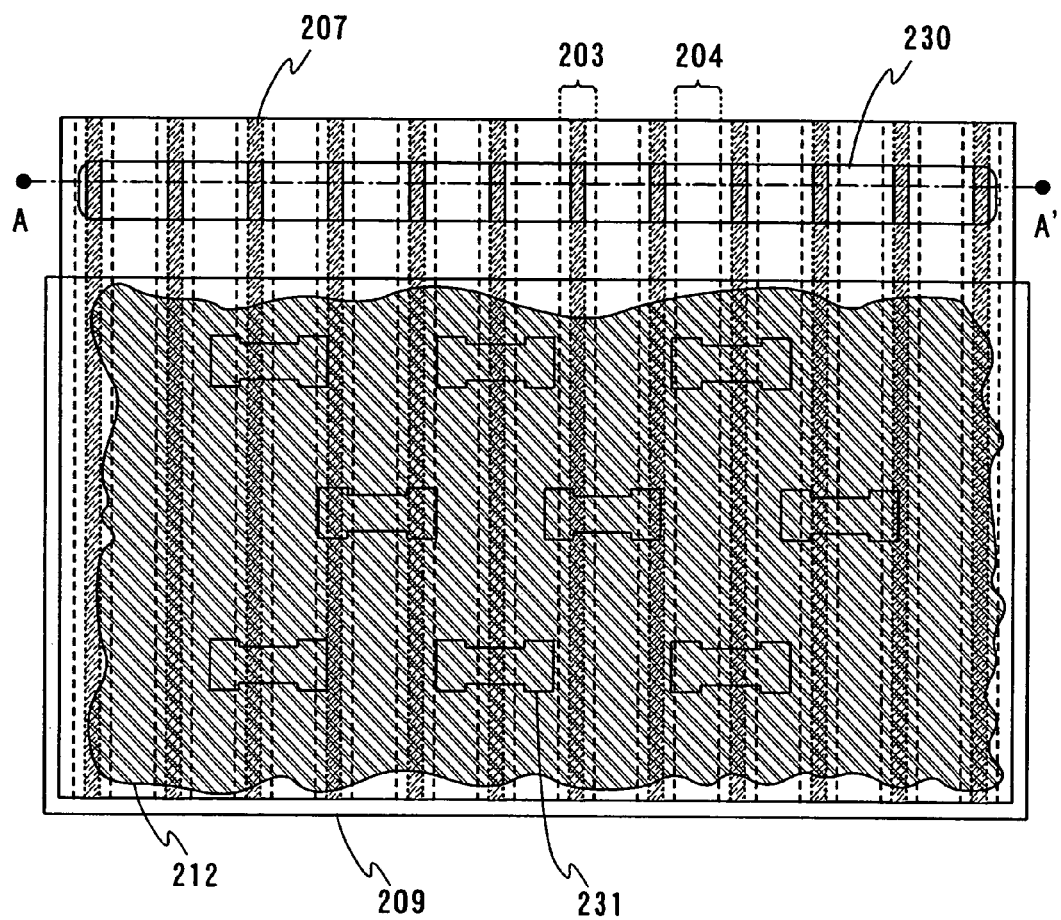
FIGS. 5A and 5B show the peeling method of the invention.
Figure 5B:
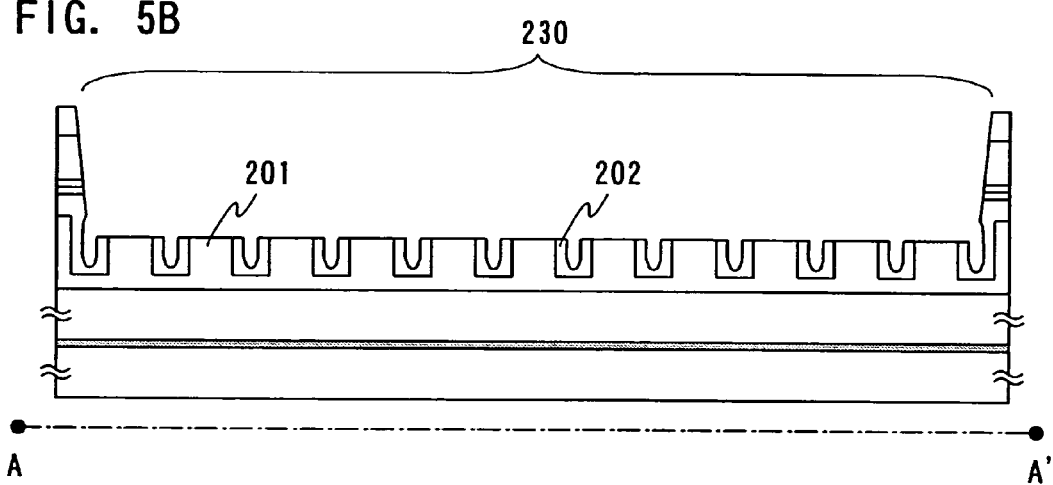

Moreover, in the case of performing wet etching, an opening portion 230 which extends to a part of the void 207 is formed, and the protective layer 212 is formed so as to cover the semiconductor element 206. FIG. 5A is a top view of the opening portion 230 shortly after the formation thereof, and FIG. 5B is a cross sectional view of the top view along a line A–A'. In FIG. 5A, only a layout of active layer 231 which is included in the semiconductor element 206 is shown. The depth of the opening portion 230 is adjusted to extend a part of the void 207, and the opening portion 230 is formed without covering the region in which the semiconductor element 206 is formed. It is to be noted that the opening portion 230 is not necessarily formed at the timing shown in this embodiment mode, and it may be formed either before forming the protective layer 212 or before attaching the second substrate 209 or the third substrate 211. Alternatively, the opening portion 230 may be formed in manufacturing steps of the semiconductor element.

Figure 6A:
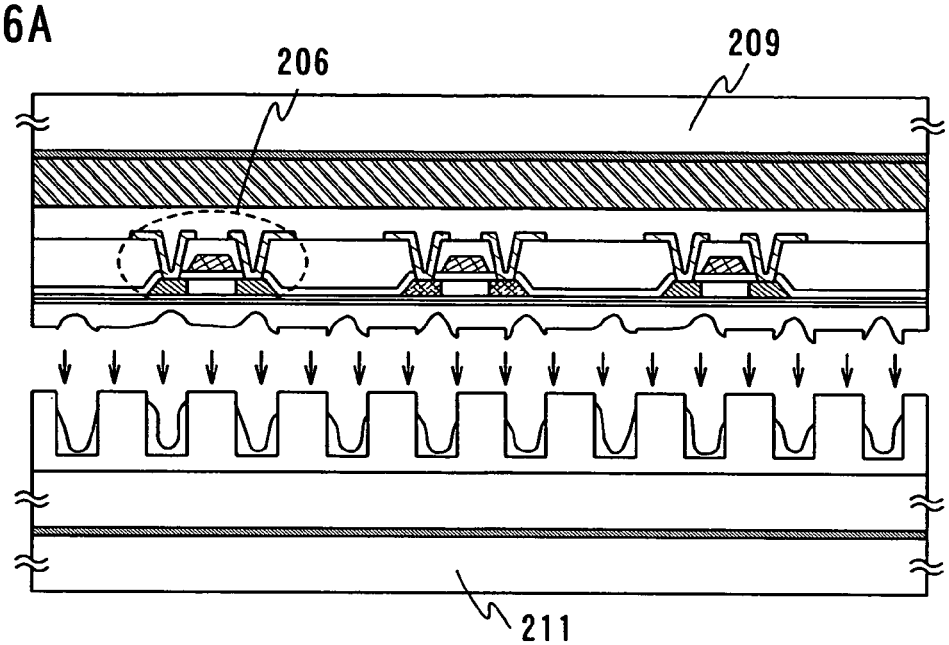
FIGS. 6A and 6B show the peeling method of the invention.
Figure 6B:
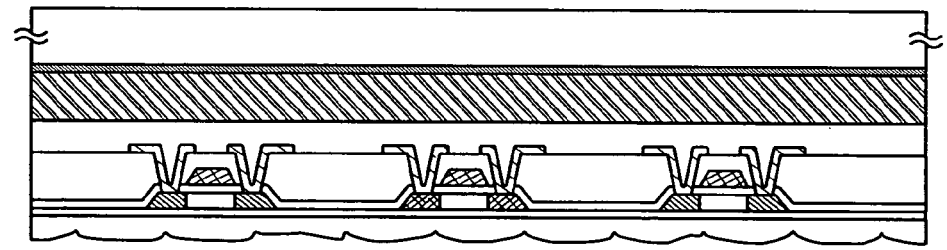

Then, an etchant is diffused from the opening portion 230 inside the void 207 in order to etch the inner wall of the void 207. As a result, the second base layer 202 is separated at the void 207 into the first substrate 200 side and the second substrate 209 side (FIG. 6A). By this peel-off, the second base layer 202 is separated at an intersecting surface with the void into the first substrate 200 side and the second substrate 209 side, and depending on an insulating layer to be used, the first base layer 201 may be partially separated into the first substrate 200 side and the second substrate 209 side. Accordingly, as shown in FIG. 6B, after the peel-off, a part of the second base layer 202 and a part of the first base layer 201 which are peeled off with the second substrate 209 may be partially or completely removed by etching.

In this embodiment mode, wet etching is performed at a temperature of 20° C. by using as an etchant a mixed solution (a product of Stella Chemifa Corporation, product name LAL500) of 7.13% ammonium bifluoride (NH$_4$HF$_2$) and 15.4% ammonium fluoride (NH$_4$F). However, conditions of etching are not limited to these and can be determined by a designer appropriately.

It is to be noted that although all the peeling steps are performed by etching in this embodiment mode, physical forces may be applied after etching. For the physical forces, air pressure of gas sprayed from a nozzle, ultrasonic waves and the like can be used. Alternatively, the void 207 may be fractured from the edge of the substrate by laser irradiation or spraying water or other liquid to perform the peel-off.

With reference to FIGS. 7A and 7B, a transferring method of a light emitting device will be explained specifically. The light emitting device is preferably transferred before forming an electro-luminescent layer. In this embodiment mode, a pixel electrode is formed and transferred before the deposition of an organic resin layer used as a bank between pixels.

FIG. 7A is a cross sectional view of a pixel when the transfer is completed. Reference numeral 501 denotes a TFT used for a driver circuit and 502 denotes a TFT used for controlling a current supplied to a light emitting element. A pixel electrode 503 of a light emitting element is electrically connected to the TFT 502. The pixel electrode 503 is formed of a transparent layer, for example an ITO. A transparent layer is used for the pixel electrode of a light emitting element in this embodiment mode, though the invention is not limited to this. It is preferable to optimize the structure of a light emitting element appropriately depending on a light direction from the light emitting element, that is, whether a light from the light emitting element is directed to an element substrate side or to the opposite side thereof.

After transferring, a bank 504 having an opening portion to partially expose the pixel electrode 503 is formed as shown in FIG. 7B. In this embodiment mode, the bank 504 is formed of an organic resin layer. In the opening portion of the bank 504, an electro-luminescent layer 505 and a cathode 506 are formed on the pixel electrode 503 to be layered. An overlapping area of the pixel electrode 503, the electro-luminescent layer 505 and the cathode 506 corresponds to a light emitting element 507.

It is to be noted that a transparent conductive layer provided by mixing 2 to 20% of zinc oxide (ZnO) with indium oxide as well as the ITO may be used for the pixel electrode 503. The surface of the pixel electrode 503 may be rubbed by CMP and cleaned by a swab using a polyvinyl alcohol porous body to be flat. After rubbing it by CMP, irradiation of UV rays, O$_2$ plasma processing and the like may be performed to clean the surface of the pixel electrode 503. The electro-luminescent layer 505 can be formed of a single light emitting layer or a plurality of layers including a light emitting layer. The cathode 506 may be formed of any one of known conductive layers with a small work function, preferably using a material such as Ca, Al, CaF, MgAg and AlLi.

The bank 504 is preferably heated in a vacuum atmosphere in order to remove absorbed moisture and oxygen before forming the electro-luminescent layer 505. Specifically, heat treatment is applied in a vacuum atmosphere, at a temperature of from 100 to 200° C. and for approximately 0.5 to 1 hour. The vacuum is desirably set at 3×10$^{-7}$ Torr or less, and if possible at 3×10$^{-8}$ Torr or less. In the case where the electro-luminescent layer 505 is formed after applying the heat treatment to the bank 504 in the vacuum atmosphere, the reliability can be further improved by maintaining the electro-luminescent layer 505 in the vacuum atmosphere until immediately before the deposition.

Further, as to the opening portion of the bank 504, in which the pixel electrode 503 is exposed, an end portion of the opening portion is preferably formed to be roundish. According to this, the electro-luminescent layer 505 can be prevented from being too thinned and broken at the end portion, and the pixel electrode 503 and the cathode 506 can also be inhibited from being short circuited, thus a defect of the light emitting element 507 can be suppressed. Moreover, by alleviating the stress at the end portion of the electro-luminescent layer 505, a defect called shrink in which a light emitting region is diminished can be suppressed and the reliability can thus be improved. Specifically, a radius of curvature of a curve which is drawn by a cross section of the organic resin layer in the opening portion is desirably in the range of 0.2 to 2 μm approximately.

The light emitting element 507 is covered with a protective layer 508 in order to prevent a substance such as moisture and oxygen from being absorbed in the light emitting element 507 and accelerating deterioration of the light emitting element 507. Typically, for the protective layer 508, a layer such as a DLC layer, a carbon nitride layer, and a silicon nitride layer formed by an RF sputtering is preferably used. It is also possible to use for the protective layer 508 a laminated layer of a layer which transmits the moisture, the oxygen and the like with difficulty and a layer which transmits the moisture, the oxygen and the like with ease.

Further, after forming the protective layer 508, the light emitting element 507 may be covered with a resin added with a drying agent in order to strengthen the sealing of the light emitting element 507. It is to be noted the resin added with a drying agent may be used for attaching a semiconductor element to be transferred in subsequent steps.

As described above, by using an insulating layer having recessed portions and projective portions, the size, form and layout of a void can be easily optimized, and physical forces required for peeling off or processing time required for facilitating the peel-off can be reduced, hence the semiconductor element can be peeled off with little deterioration. Moreover, by using an insulating layer having recessed portions and projective portions, which enables to optimize the size, form and layout of a void, an etchant can be effectively diffused inside the void and the inner wall of the void which contacts with etchant can be enlarged. Accordingly, processing time required for etching can be reduced. In the case where the semiconductor element is physically peeled off after etching, the physical forces required for the peel-off can also be reduced, and thus the semiconductor element can be peeled off with little deterioration. Further, according to the invention, when the peel-off is performed, it is not necessary to irradiate laser beam directly to a semiconductor element, and either to perform heat treatment which adversely affects the properties of the semiconductor element. Therefore, a semiconductor layer can be kept with little deterioration. In addition, internal stresses of the second base layer and the semiconductor layer can be lowered due to the void, and stress migration during manufacturing steps of the semiconductor element can also be improved.

EMBODIMENT MODE 2

Explanation will be hereinafter made on a manufacturing method of a first base layer which has recessed portions and projective portions and is formed of an insulating layer. Needless to say, the manufacturing method and structure of the first base layer described below is just an example, and the invention is not limited this.

Figure 8A:
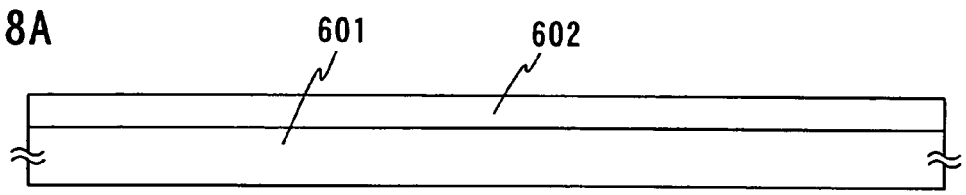
FIGS. 8A to 8C show a manufacturing method of recessed portions and projective portions by using an insulating layer.

First, a first insulating layer 602 is formed on a first substrate 601 as shown in FIG. 8A. A silicon oxynitride layer is used for the first insulating layer 602 in this embodiment mode, though the invention is not limited to this and other insulating layer can be used as long as it has high etching selectivity relative to a second insulating layer formed thereon. In this embodiment mode, $SiH_4$ and $N_2O$ are deposited by CVD to have a film thickness of 50 to 200 nm to form the first insulating layer 602. The first insulating layer 602 may have either a single layer structure or a laminated structure of a plurality of insulating layers.

Figure 8B:
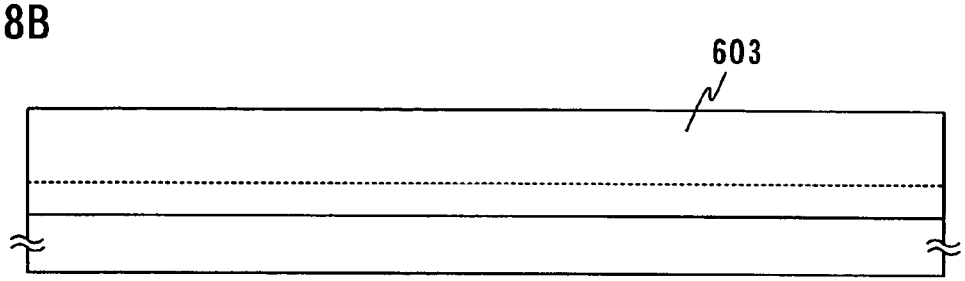

Next, a second insulating layer 603 is formed on the first insulating layer 602 as shown in FIG. 8B. Since the second insulating layer 603 is patterned to form a projective portion in a subsequent step, the film thickness of the second insulating layer 603 has to be determined in taking the depth of the projective portion into account. In this embodiment mode, silicon oxide is deposited by plasma CVD to have a thickness of 0.5 to 3 µm to form the second insulating layer 603.

Figure 8C:
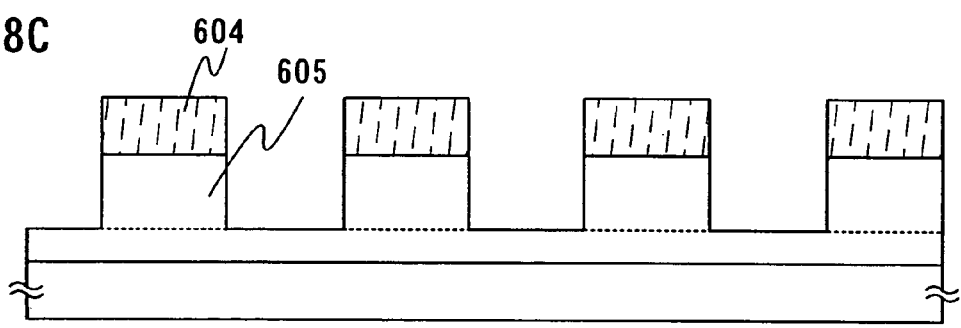

Subsequently, a mask 604 is formed and then the second insulating layer 603 is etched as shown in FIG. 8C. In this embodiment mode, wet etching is performed at a temperature of 20° C. by using as an etchant a mixed solution (a product of Stella Chemifa Corporation, product name LAL500) of 7.13% ammonium bifluoride ($NH_4HF_2$) and 15.4% ammonium fluoride ($NH_4F$). By this etching step, a projective portion 605 can be obtained. The first insulating layer 602 and the projective portion 605 are collectively referred to as a first base layer.

When aluminum nitride, aluminum nitride oxide or silicon nitride is used for the first insulating layer 602 and silicon oxide is used for the second insulating layer 603, the second insulating layer 603 is desirably patterned by RF sputtering. Aluminum nitride, aluminum nitride oxide or silicon nitride used for the first insulating layer 602 has high thermal conductivity. Therefore, it can immediately diffuse the generated heat, and deterioration of TFTs can thus be prevented.

Figure 9A:
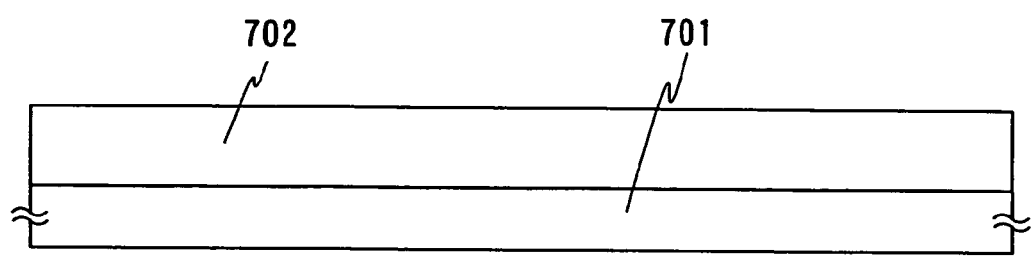
FIGS. 9A and 9B show a manufacturing method of recessed portions and projective portions by using an insulating layer.

Another forming method of a first base layer is explained hereinafter. First, an insulating layer 702 is formed on a first substrate 701 as shown in FIG. 9A. Either of silicon oxide layer, silicon nitride layer, silicon oxynitride layer and the like is used for the insulating layer 702. When using a silicon oxide layer, it can be formed by plasma CVD using a mixture of tetraethyl orthosilicate (TEOS) and $O_2$, at a reaction pressure of 40 Pa, at a substrate temperature of 300 to 400° C., and by discharging at a high frequency (13.56 MHz) electric power density of 0.5 to 0.8 W/cm². In the case of using a silicon oxynitride layer, it can be formed by plasma CVD using $SiH_4$, $N_2O$, and $NH_3$, or using $SiH_4$ and $N_2O$, at a reaction pressure of 20 to 200 Pa, at a substrate temperature of 300 to 400° C., and at a high frequency (60 MHz) electric power density of 0.1 to 1.0 W/cm². Similarly, a silicon nitride layer can be formed by plasma CVD using $SiH_4$ and $NH_3$.

The insulating layer 702 is patterned to form projective portions in a subsequent step. Accordingly, the film thickness of the insulating layer 702 has to be determined in taking the depth of the projective portions into account. In this embodiment mode, the insulating layer 702 is formed so as to have a thickness of 0.5 to 3 µm.

Figure 9B:
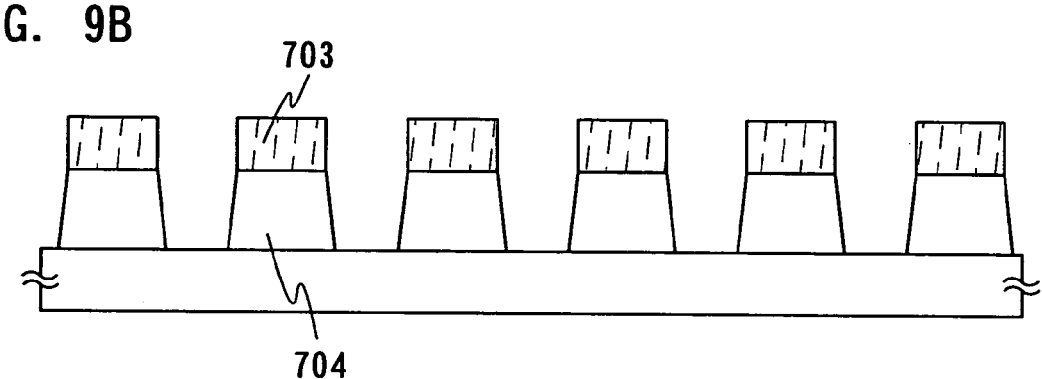

Subsequently, a mask 703 is formed using photolithography as shown in FIG. 9B. Then, unwanted portions are removed by etching to form a first base layer 704 having projective portions. Either dry etching using a fluoride gas or wet etching using an aqueous solution of a fluoride may be performed herein. In the latter case, wet etching may be performed by using a mixed solution (a product of Stella Chemifa Corporation, product name LAL500) of 7.13% ammonium bifluoride ($NH_4HF_2$) and 15.4% ammonium fluoride ($NH_4F$).

The first base layer 704 can be completed with a state shown in FIG. 9B, though an insulating layer may be formed so as to cover the first base layer 704 and the first substrate 701. The insulating layer is provided in order to cover exposed regions of the first base layer 704. Therefore, by using a film which has excellent step coverage, the insulating layer is formed so thin that no void is formed. It is thus desirable to determine the film thickness of the insulating layer in taking the depth of the projective portion and the area of an opening portion. The insulating layer may be formed of a silicon oxide layer, a silicon nitride layer, a silicon oxynitride layer and the like.

EMBODIMENT MODE 3

Explanation will be hereinafter made on a peeling method of the invention when using a metal layer for a first base layer.

Figure 10A:
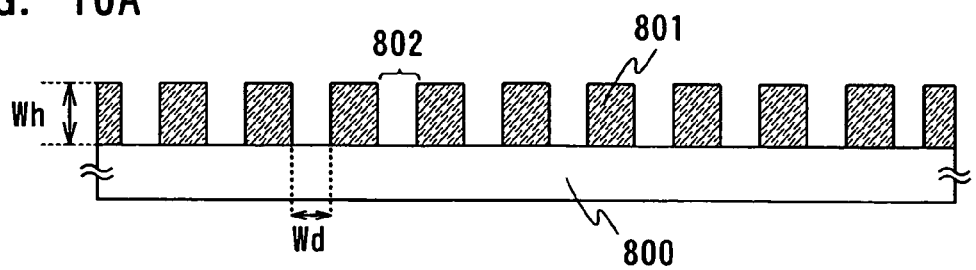
FIGS. 10A to 10D show the peeling method of the invention in the case where a metal layer is used for the first base layer.
Figure 10B:
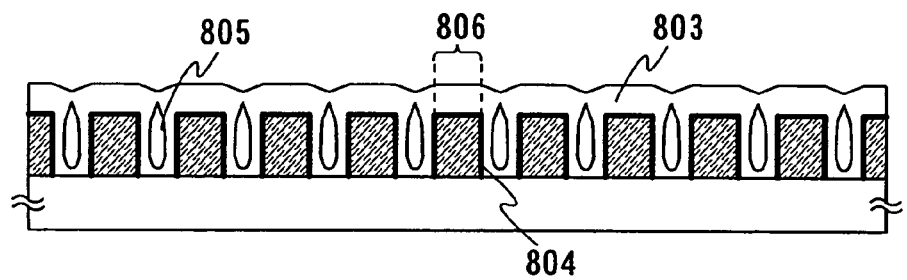

First, a first base layer 801 having recessed portions and projective portions is formed on a first substrate 800 as shown in FIG. 10A. As well as the case shown in Embodiment Mode 1, in which an insulating layer is used for a first base layer, the first substrate 800 can be formed of a material which is capable of withstanding a heat treatment in subsequent steps. The first base layer 801 is formed of W (tungsten) in this embodiment mode. A metal layer is deposited on the first substrate 800 by sputtering and patterned in order to form the first base layer 801. The first base layer 801 may have either a single layer structure or a laminated structure of metal layers.

The form of the recessed portions and projective portions can be appropriately determined by a designer in accordance with a deposition method and a peeling method. In this embodiment mode, a recessed portion 802 is stripe shaped, and the width Wd which is perpendicular to the longitudinal direction of the recessed portion is 1 μm or less and the depth Wh is 2 μm or more.

After forming the first base layer 801, a second base layer 803 is formed thereon without exposing them to the atmosphere. A silicon oxide layer is deposited by sputtering herein to form the second base layer 803. When forming the second base layer 803 in this embodiment mode, presputtering is performed as the preliminary step of the sputtering, in which a target and the substrate are blocked off with a shutter to generate plasma. This presputtering step is performed by using Ar at a flow rate of 10 sccm and $O_2$ at a flow rate of 30 sccm while maintaining the first substrate 800 at a temperature of 270° C. and a deposition power at 3 kW. By the presputtering step, an ultrathin metal oxide layer 804 having a thickness of a few nanometers (3 nm herein) is formed between the first base layer 801 and the second base layer 803. The metal oxide layer 804 is obtained by oxidizing a surface of the first base layer 801, hence the metal oxide layer 804 is formed of tungsten oxide in this embodiment mode.

Although the metal oxide layer 804 is formed by presputtering in this embodiment mode, the invention is not limited to this. For example, the surface of the first base layer 801 may be intentionally oxidized with plasma by adding $O_2$ or a mixture of $O_2$ and an inert gas such as Ar in order to form the metal oxide layer 804. In the case where the metal oxide layer 804 is not formed by presputtering, the second base layer 803 may be formed by coating, plasma CVD and the like as well as by sputtering.

The second base layer 803 is desirably formed of an insulating layer. Specifically, a silicon oxide layer, a silicon nitride layer, a silicon nitride oxide layer and other known insulating layers are available. In this embodiment mode, a silicon oxide layer is deposited by sputtering to obtain the second base layer 803. The second base layer 803 is formed so as to be thick enough to block an opening portion of the recessed portion 802 and form a void 805. Accordingly, it is preferable to determine the film thickness of the second base layer 803 appropriately depending on the form of the recessed portion 802 and the deposition method. In this embodiment mode, the film thickness on a projective portion 806 of the first base layer 801 is approximately 1 μm.

In the case of performing sputtering, the deposition is performed also to the edge of the first substrate 800. Therefore, it is preferable to selectively remove the second base layer 803 formed at the edge of the first substrate 800 by $O_2$ ashing and the like, or to cut the edge of the first substrate 800 by dicing and the like. Thus, the second base layer 803 can be easily peeled off at the void 805 in subsequent peeling steps.

Figure 10C:
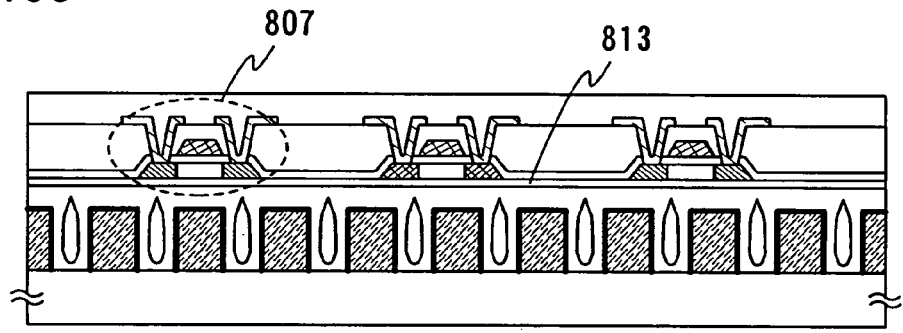

As well as the case shown in Embodiment Mode 1, in which an insulating layer is used for a first base layer, a third base layer 813 is formed and a semiconductor element 807 which is a TFT herein is formed on the third base layer 813 (FIG. 10C). However, unlike in the case of Embodiment Mode 1, the metal oxide layer 804 is crystallized in manufacturing steps of the semiconductor element 807 in order to facilitate the subsequent peeling steps. By the crystallization, the metal oxide layer 804 is weakened and easily broken in the grain boundary. In this embodiment mode, a heat treatment is conducted at a temperature of 420 to 550° C. for approximately 0.5 to 5 hours to crystallize the metal oxide layer 804. This heat treatment may be performed before forming the semiconductor element 807, or a heat treatment during manufacturing steps of the semiconductor element 807 may be used for the crystallization of the metal oxide layer 804.

Figure 10D:
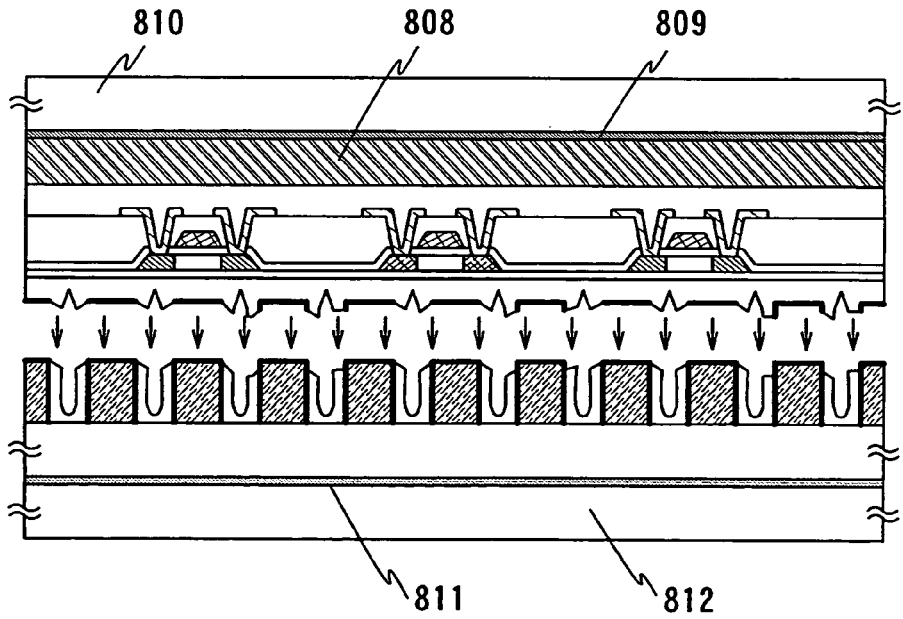

As well as the case shown in Embodiment Mode 1, a protective layer 808 is formed so as to cover the semiconductor element 807. Then, a second substrate 810 is attached on the protective layer 808 with a two-sided tape 809, and a third substrate 812 is attached on the opposite surface of the first substrate 800 with a two-sided tape 811. A treatment for facilitating the peeling steps is performed. Subsequently, the second base layer 803 is separated at the void 805 or the metal oxide layer 804 into the first substrate 800 side and the second substrate 810 side by physical forces (FIG. 10D). According to this, the semiconductor element 807 is peeled off with the second substrate 810.

Afterward, the semiconductor element can be transferred in the same steps as those described in Embodiment Mode 1.

As described above, the metal oxide layer is weakened by the crystallization in this embodiment mode. Accordingly, physical forces required for the peel-off and processing time required for facilitating the peel-off can be reduced, thus the semiconductor element can be peeled off with little deterioration.

Although a metal layer used for the first base layer is formed of tungsten in this embodiment mode, a material of the metal layer is not limited to this in the invention. Any material including metal can be used as long as a metal oxide layer can be formed thereon and the substrate can be peeled off by crystallizing the metal oxide layer. For example, TiN, WN, Mo and the like or alloy of these materials can be used. In the case of using the alloy for the metal layer, the optimum temperature of the heat treatment for the crystallization varies in accordance with a composition ratio thereof. Therefore, by varying the composition ratio, the heat treatment can be performed at the optimum temperature which does not obstruct the manufacturing steps of the semiconductor element, thus the semiconductor element can be manufactured with few restrictions.

EMBODIMENT

Embodiment 1

Explanation will be hereinafter made on an example of manufacturing method and structure of a TFT which is peeled off by the peeling method according to the invention.

Figure 11A:
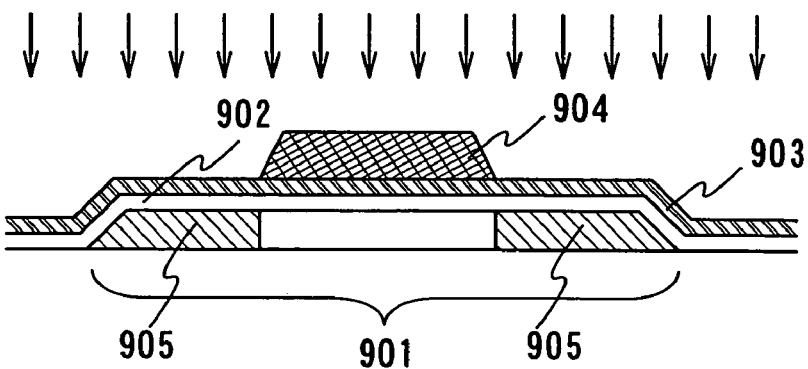
FIGS. 11A to 11D show manufacturing steps of a TFT.

On the third base layer, an island-shaped semiconductor layer 901 is formed, and a gate insulating layer 902, a first conductive layer 903 and a second conductive layer are formed in this order so as to cover the island-shaped semiconductor layer 901. The second conductive layer is patterned to form a first gate electrode 904 which functions as a part of a gate electrode. Then, the island-shaped semiconductor layer 901 is doped with one conductivity type impurities by using the first gate electrode 904 as a mask. In this embodiment mode, n-type impurities are doped for example. First impurity regions 905 are formed in the island-shaped semiconductor layer 901 by the doping step (FIG. 11A).

Figure 11B:
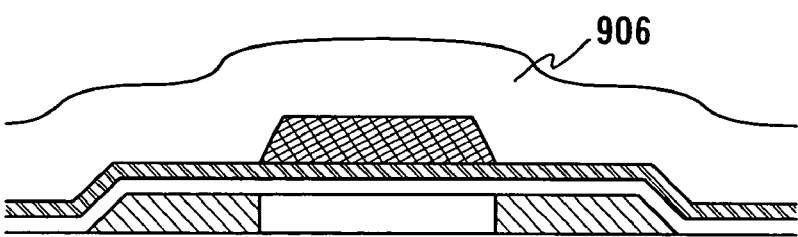

An insulating layer 906 for forming a side wall is formed so as to cover the first gate electrode 904 and the first conductive layer 903 (FIG. 11B). The insulating layer 906 can be formed of a silicon oxide layer, a silicon nitride layer, a silicon oxynitride layer and other insulating layer.

Figure 11C:
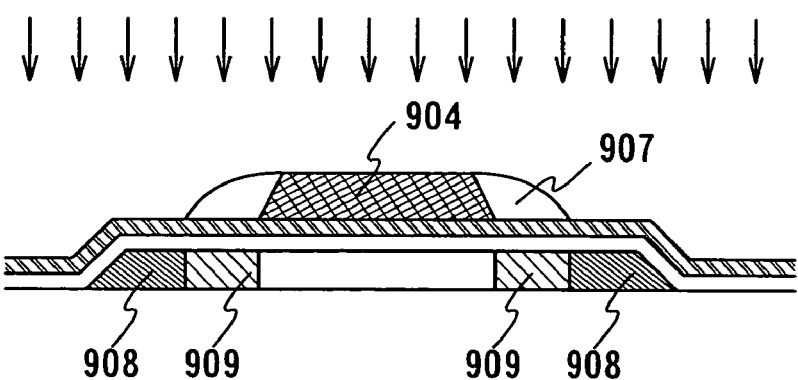
Figure 11D:
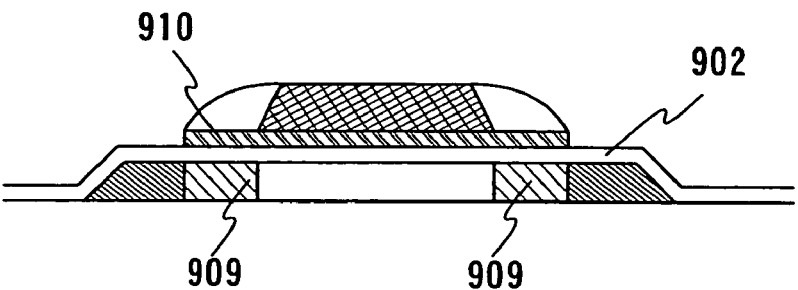

By anisotropically etching the insulating layer 906 for forming a side wall, a side wall 907 formed of an in insulating layer is obtained. FIG. 11C shows a form of the side wall 907 obtained by anisotropically etching. In FIG. 11C, the side wall 907 is formed so as to cover only side walls of the first gate electrode 904, though the side wall 907 may be formed so as to cover a part or whole of the top area of the first gate electrode 904. The side wall 907 is overlapped with only parts of the first impurity regions 905 with the gate insulating layer 902 and the first conductive layer 903 interposed therebetween. That is, parts of the island-shaped semiconductor layer 901 are not overlapped with the side wall 907. These regions which are not overlapped with the side wall 907 are doped with the same conductivity impurities as used in the doping step above by using the first gate electrode 904 and the side wall 907 as masks. Second impurity regions 908 are formed by this doping step, each of which functions as a source region or a drain region. The concentration of impurities in the second impurity regions 908 is higher than that in the first impurity regions 905.

Regions 909 of the island-shaped semiconductor layer 901, which are not overlapped with the first gate electrode 904 but overlapped only with the side wall 907, are parts of the first impurity regions 905 originally. Therefore, the concentration of impurities in these regions 909 (hereinafter referred to as third impurity regions) is lower than that in the second impurity regions 908. The third impurity regions 909 function as LDD regions.

Subsequently, the first conductive layer 903 is etched by using the first gate electrode 904 and the side walls 907 as a mask. As a result, a second gate electrode 910 is formed, which functions as a part of the gate electrode. The second gate electrode 910 is overlapped with the third impurity regions 909 with the gate insulating layer 902 interposed therebetween.

It is to be noted that a semiconductor element to which the peeling method of the invention can be applied is not limited to the TFT described in this embodiment. For example, the peeling method of the invention can be applied to all types of circuit elements such as a memory, a diode, an optoelectric converter, a resistor, a coil, a capacitor, and an inductor.

Embodiment 2

Figure 12:
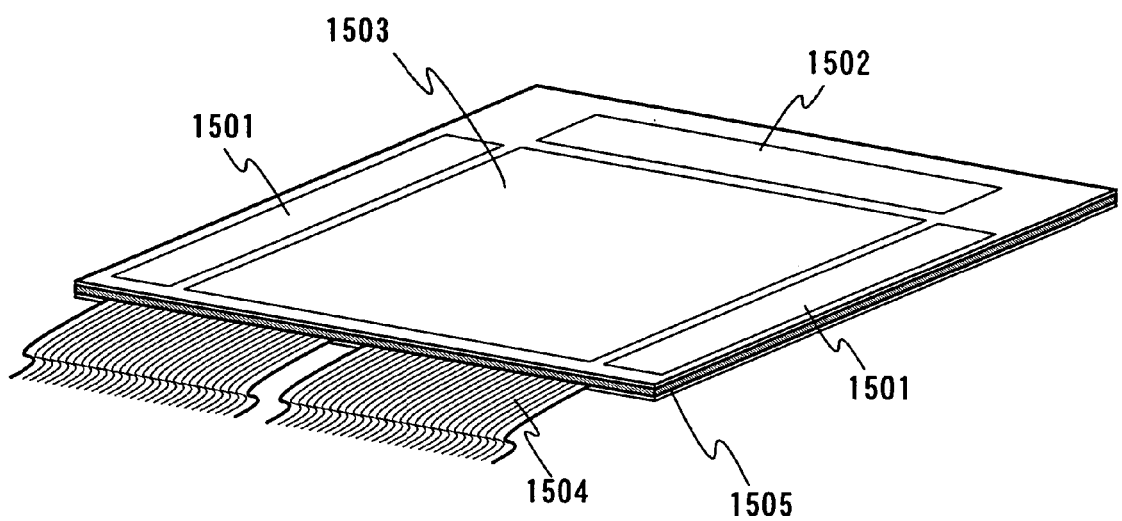
FIG. 12 is an outline view of a display device formed by transferring semiconductor elements.

FIG. 12 shows an outline view of a display device which is formed by using the peeling method of the invention. The display device shown in FIG. 12 comprises a pixel portion 1503 including a plurality of pixels, scan line driver circuits 1501 for selecting a pixel, and a signal driver circuit 1502 for supplying the selected pixel with a video signal. Signals and power supply potentials are supplied from an FPC 1504 to drive the pixel portion 1503, the signal driver circuit 1502 or the scan line driver circuits 1501. In this embodiment mode, a plastic substrate is used for an element substrate 1505 on which semiconductor elements are transferred. As the display device is formed by using a plastic substrate for the element substrate 1505, the mechanical strength of the display device can be improved and the thickness and weight thereof can be reduced as compared with the case of using a glass substrate for the element substrate.

Embodiment 3

An example of the layout of the first base layer will be described in Embodiment 3.

Figure 13:
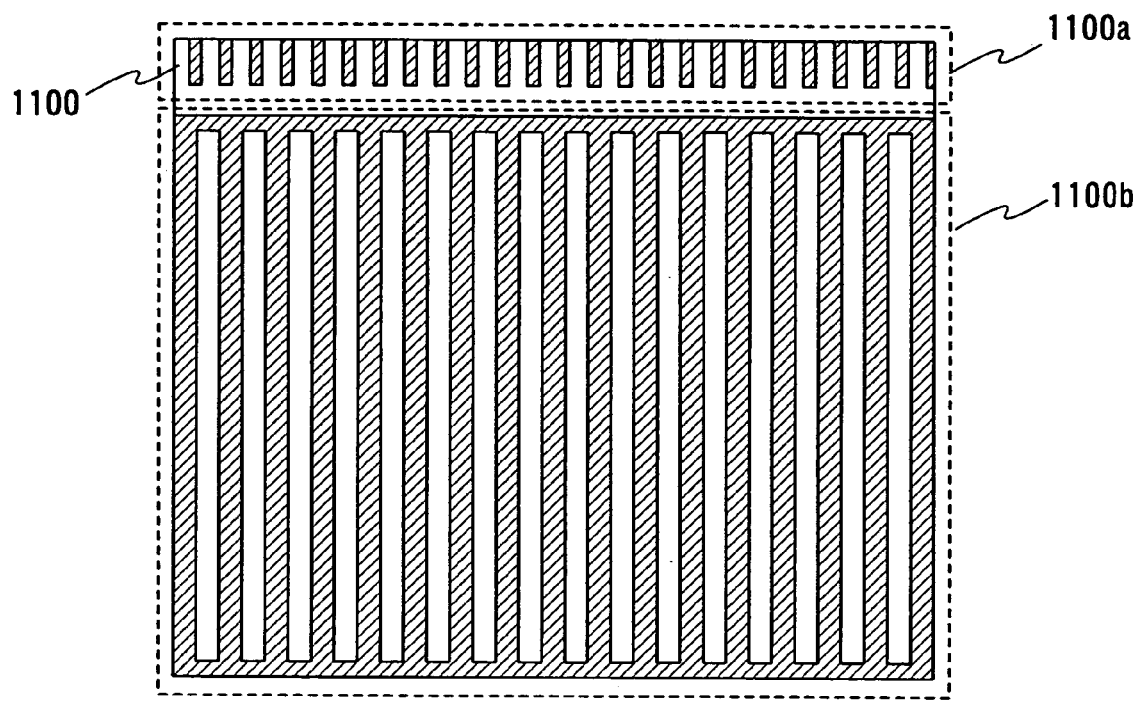
FIG. 13 shows an example of the layout of recessed portions and projective portions.

FIG. 13 is a top view of a first substrate 1100 when the first base layer is formed. As shown in FIG. 13, the first base layer is composed of two areas 1100a and 1100b. In the area 1100a, a plurality of projective portions are arranged in striped pattern, and voids are formed in recessed portions between the projective portions. In the area 1100b, a plurality of rectangular recessed portions are arranged, and voids are formed in the rectangular recessed portions.

In the area 1100a, the volume of the voids can be controlled by the width between the projective portions arranged in striped pattern (namely the width of the recessed portions). Meanwhile, the volume of the voids in the area 1100b can be controlled by the width which is perpendicular to the longitudinal direction of the rectangular recessed portions (namely the width of the recessed portion).

In this embodiment mode, a treatment for facilitating the subsequent peeling steps is performed in the area 1100a, and the peel-off is started from this area. Accordingly, in order to perform the peeling steps in the area 1100a more easily than in the area 1100b, the width of the recessed portion in the area 1100a is narrower than that in the area 1100b, and the volume of the voids in the area 1100a is larger than that in the area 1100b.

The region in which semiconductor elements are formed has more recessed portions in the area 1100b than in the area 1100a. Therefore, various kinds of solutions used in each step tend to remain in the recessed portions in the area 1100b as compared with the area 1100a. The solutions remaining in the recessed portions may adversely affect the properties of the semiconductor elements in the subsequent steps. Hence, the recessed portions of the first base layer are preferably surrounded on all four sides by the projective portions in the area 1100b.

It is to be noted that the form of the recessed portion is not necessarily rectangular as shown in this embodiment. The same advantageous effect can be brought about when the recessed portion has a different form as long as the void can be formed in the recessed portion.

Embodiment 4

As to the deposition method of the second base layer 202 by RF sputtering described in Embodiment Mode 1, conditions of the deposition will be specifically explained.

In this embodiment, the deposition is performed at a substrate temperature of 100 to 200° C., for example 150° C., by using a $SiO_2$ target with a diameter of 305 mm, at an RF power of 3 kW, and in an Ar atmosphere at a pressure of 0.4 Pa. The flow rate of Ar is 60 sccm in total, and 10 sccm of it is heated and sprayed onto the backside of the substrate so as to prevent the substrate temperature from being changed. The deposition speed is in the range of 68 to 72 nm/min.

When the second base layer 202 formed under the deposition conditions described above is peeled off by wet etching, the wet etching is performed at a temperature of 20° C. by using as an etchant a mixed solution (a product of Stella Chemifa Corporation, product name LAL500) of 7.13% ammonium bifluoride ($NH_4HF_2$) and 15.4% ammonium fluoride ($NH_4F$). According to this, the wet etching can be performed at an etch rate of 360 to 800 nm/min approximately. It is to be noted that the conditions of etching are not limited to these and can be appropriately determined by a designer.

The deposition conditions of the second base layer 202 described in this embodiment are just examples and not limited to these.

Embodiment 5

Explanation will be hereinafter made on an example of the layout of the first base layer and the opening portion.

Figure 14A:
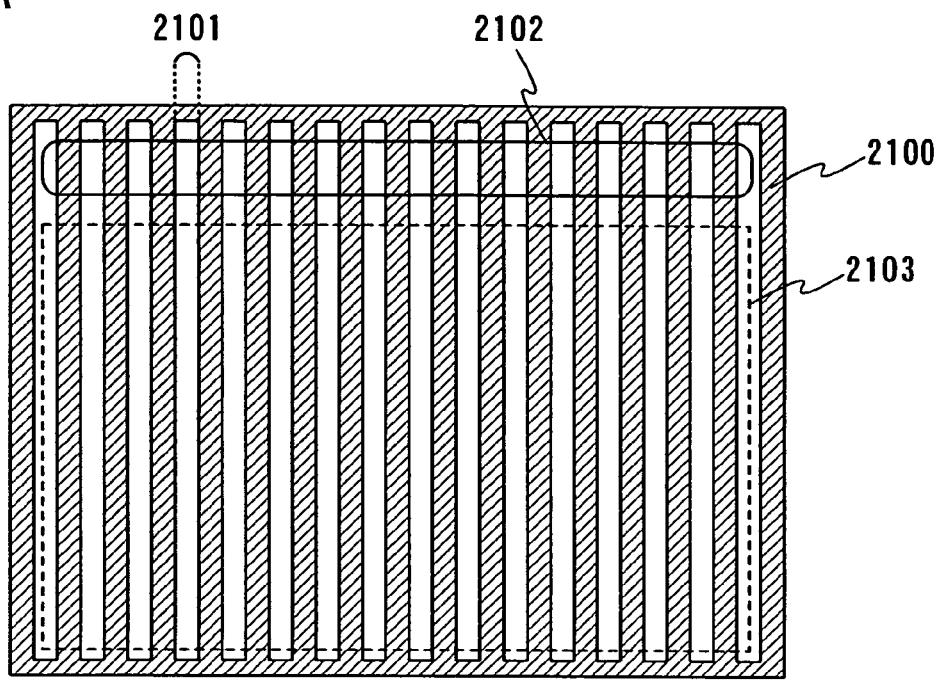
FIGS. 14A and 14B show an example of the layout of recessed portions and projective portions.

FIG. 14A is a top view of a first base layer 2100 immediately after forming the first base layer 2100. As shown in FIG. 14A, a plurality of rectangular recessed portions 2101 are arranged in the first base layer 2100. A void is formed so as to extend in the longitudinal direction of the recessed portion 2101. The volume of the void can be controlled by the width which is perpendicular to the longitudinal direction of the plurality of rectangular recessed portions 2101 (namely the width of the recessed portion 2101). It is to be noted that either a single void or a plurality of voids may be formed in each recessed portion 2101.

Reference numeral 2102 denotes an area in which an opening portion is formed in subsequent steps. Reference numeral 2103 denotes an area in which semiconductor elements are formed in subsequent steps. The area 2102 is preferably laid out so as not to be overlapped with the area 2103.

In FIG. 14A, the single area 2102 is at least partially overlapped with the plurality of recessed portions 2101. The inner wall of the void is exposed and immersed in an etchant in the overlapping area of the area 2101 and the area 2102. Accordingly, the etchant can be diffused inside the void in the area which is not overlapped with the area 2102.

Figure 14B:
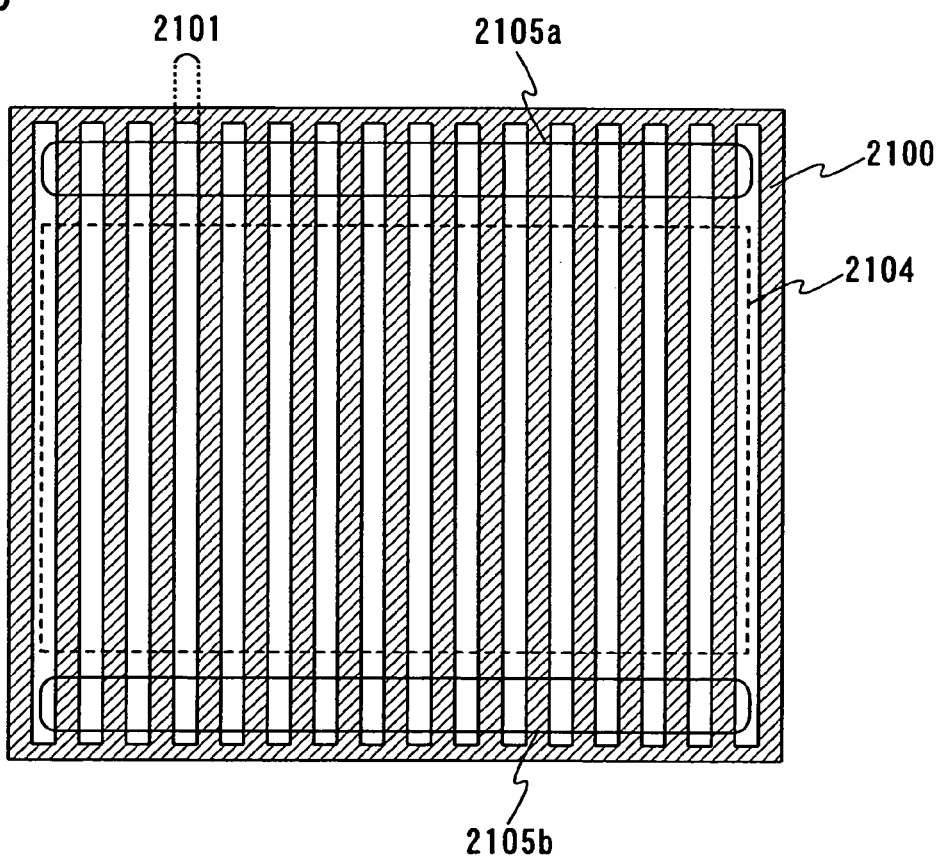

With reference to FIG. 14B, a different layout of the opening portion is explained. FIG. 14B is a top view of the first base layer 2100 immediately after forming the first base layer 2100. The layout of the first base layer 2100 is the same as that shown in FIG. 14A. Reference numerals 2105a and 2105b denote areas in which opening portions are formed in subsequent steps. Reference numeral 2104 denotes an area in which semiconductor elements are formed in subsequent steps. The areas 2105a and 2105b are preferably laid out so as not to be overlapped with the area 2104.

In FIG. 14B, the area 2104 is provided between the area 2105a and the area 2105b, and the areas 2105a and 2105b are partially overlapped with the plurality of recessed portions 2101. The inner wall of the void is exposed and immersed in an etchant in the overlapping area of the areas 2105a and 2105b and the recessed portion 2101. Accordingly, the etchant can be diffused inside the void in the area which is not overlapped with the areas 2105a and 2105b. As the two opening portions are provided in a single recessed portion 2101, the etchant can be diffused inside the void more efficiently, and processing time required for etching can be reduced.

In both of FIGS. 14A and 14B, the recessed portion 2101 of the first base layer 2100 is overlapped with the areas 2103 and 2104 in which semiconductor elements are formed. Therefore, various kinds of solutions used in each step may remain in the recessed portion 2101, and the solutions remaining in the recessed portion 2101 may adversely affect the properties of the semiconductor elements. Hence, the recessed portion 2101 of the first base layer 2100 is preferably surrounded on all four sides by projective portions.

It is to be noted that the form of the recessed portion is not necessarily rectangular as shown in this embodiment. The same advantageous effect can be brought about when the recessed portion has a different form as long as the void can be formed in the recessed portion.

This application is based on Japanese Patent Application serial no. 2003-052139 filed in Japan Patent Office on $28^{th}$, Feb. 2003, and Japanese Patent Application serial no. 2003-052940 filed in Japan Patent Office on $28^{th}$, Feb. 2003, the contents of which are hereby incorporated by reference.

Although the present invention has been fully described by way of embodiments and embodiments mode with reference to the accompanying drawings, it is to be understood that various changes and modifications will be apparent to those skilled in the art. Therefore, unless otherwise such changes and modifications depart from the scope of the present invention hereinafter defined, they should be constructed as being included therein.

What is claimed is:

1. A method for peeling off a semiconductor element comprising:

forming over a substrate a first base layer having a plurality of recessed portions;

forming on the first base layer a second base layer having a plurality of voids over a plurality of the recessed portions;

forming a third base layer over the second base layer;

forming a semiconductor element over the third base layer; and separating the second base layer at an intersecting surface with a plurality of the voids, thereby peeling off the semiconductor element from the substrate.

2. A method for peeling off a semiconductor element comprising:

forming over a substrate a first base layer having a plurality of recessed portions;

forming on the first base layer a second base layer having a plurality of voids over a plurality of the recessed portions;

forming a third base layer over the second base layer;

forming a semiconductor element over the third base layer;

forming an opening portion which extends to a part of each of a plurality of the voids; and enlarging each of a plurality of the voids by diffusing an etchant into each of a plurality of the voids from the opening portion, and separating the second base layer at an intersecting surface with a plurality of the voids, thereby peeling off the semiconductor element from the substrate.

3. A method for peeling off a semiconductor element comprising:

forming over a substrate a first base layer having a plurality of recessed portions;

forming on the first base layer a second base layer having a plurality of voids over a plurality of the recessed portions;

polishing a surface of the second base layer;

forming a third base layer over the second base layer whose surface is polished;

forming a semiconductor element over the third base layer; and separating the second base layer at an intersecting surface with a plurality of the voids, thereby peeling off the semiconductor element from the substrate.

4. A method for peeling off a semiconductor element comprising:
forming over a substrate a first base layer having a plurality of recessed portions;
forming on the first base layer a second base layer having a plurality of voids over a plurality of the recessed portions;
polishing a surface of the second base layer;
forming a third base layer over the second base layer whose surface is polished;
forming a semiconductor element over the third base layer; and
separating the second base layer with the first base layer at an intersecting surface with a plurality of the voids, thereby peeling off the semiconductor element from the substrate.

5. A method for peeling off a semiconductor element comprising:
forming over a first substrate a first base layer having a plurality of recessed portions;
forming on the first base layer a second base layer having a plurality of voids over a plurality of the recessed portions;
polishing a surface of the second base layer;
forming a third base layer over the second base layer whose surface is polished;
forming a semiconductor element over the third base layer;
forming a protective layer so as to cover the semiconductor element;
attaching a second substrate to the protective layer and attaching a third substrate to the first substrate; and
separating the second base layer at an intersecting surface with a plurality of the voids, thereby peeling off the semiconductor element and the second substrate from the first substrate and the third substrate.

6. A method for peeling off a semiconductor element comprising:
forming over a first substrate a first base layer having a plurality of recessed portions;
forming on the first base layer a second base layer having a plurality of voids over a plurality of the recessed portions;
polishing a surface of the second base layer;
forming a third base layer over the second base layer whose surface is polished;
forming a semiconductor element over the third base layer;
forming a protective layer so as to cover the semiconductor element;
attaching a second substrate to the protective layer and attaching a third substrate to the first substrate; and
separating the second base layer with the first base layer at an intersecting surface with a plurality of the voids, thereby peeling off the semiconductor element and the second substrate from the first substrate and the third substrate.

7. A method for peeling off a semiconductor element comprising:
forming over a substrate a first base layer having a plurality of recessed portions;
forming on the first base layer a second base layer having a plurality of voids over a plurality of the recessed portions;
polishing a surface of the second base layer;
forming a third base layer over the second base layer whose surface is polished;
forming a semiconductor element over the third base layer;
forming an opening portion which extends to a part of each of a plurality of the voids; and
enlarging each of a plurality of the voids by diffusing an etchant into each of a plurality of the voids from the opening portion, and separating the second base layer at an intersecting surface with a plurality of the voids, thereby peeling off the semiconductor element from the substrate.

8. A method for peeling off a semiconductor element comprising:
forming over a substrate a first base layer having a plurality of recessed portions;
forming on the first base layer a second base layer having a plurality of voids over a plurality of the recessed portions;
polishing a surface of the second base layer;
forming a third base layer over the second base layer whose surface is polished;
forming a semiconductor element over the third base layer;
forming an opening portion which extends to a part of each of a plurality of the voids; and
enlarging each of a plurality of the voids by diffusing an etchant into each of a plurality of the voids from the opening portion, and separating the second base layer with the first base layer at an intersecting surface with a plurality of the voids, thereby peeling off the semiconductor element from the substrate.

9. A method for peeling off a semiconductor element comprising:
forming over a first substrate a first base layer having a plurality of recessed portions;
forming on the first base layer a second base layer having a plurality of voids over a plurality of the recessed portions;
polishing a surface of the second base layer;
forming a third base layer over the second base layer whose surface is polished;
forming a semiconductor element over the third base layer;
forming an opening portion which extends to a part of each of a plurality of the voids on a region that is not provided with the semiconductor element;
forming a protective layer so as to cover the semiconductor element;
attaching a second substrate to the protective layer and attaching a third substrate to the first substrate; and
enlarging each of a plurality of the voids by diffusing an etchant into each of a plurality of the voids from the opening portion, and separating the second base layer at an intersecting surface with a plurality of the voids, thereby peeling off the semiconductor element and the second substrate from the first substrate and the third substrate.

10. A method for peeling off a semiconductor element comprising:
forming over a first substrate a first base layer having a plurality of recessed portions;
forming on the first base layer a second base layer having a plurality of voids over a plurality of the recessed portions;
polishing a surface of the second base layer;

forming a third base layer over the second base layer whose surface is polished;

forming a semiconductor element over the third base layer;

forming an opening portion which extends to a part of each of a plurality of the voids on a region that is not provided with the semiconductor element;

forming a protective layer so as to cover the semiconductor element;

attaching a second substrate to the protective layer and attaching a third substrate to the first substrate; and enlarging each of a plurality of the voids by diffusing an etchant into each of a plurality of the voids from the opening portion, and separating the second base layer with the first base layer at an intersecting surface with a plurality of the voids, thereby peeling off the semiconductor element and the second substrate from the first substrate and the third substrate.

11. A method for peeling off a semiconductor element comprising:

forming over a substrate a first base layer comprising a metal layer having a plurality of recessed portions and;

forming a metal oxide layer on a surface of the metal layer by oxidizing;

forming on the metal oxide layer a second base layer having a plurality of voids over a plurality of the recessed portions;

polishing a surface of the second base layer;

forming a third base layer over the second base layer whose surface is polished;

forming a semiconductor element over the third base layer and crystallizing the metal oxide layer; and separating the second base layer at an intersecting surface with a plurality of the voids and a part of the crystallized metal oxide layer, thereby peeling off the semiconductor element from the substrate.

12. A method for peeling off a semiconductor element comprising:

forming over a substrate a first base layer comprising a metal layer having a plurality of recessed portions and;

forming a metal oxide layer on a surface of the metal layer by oxidizing;

forming on the metal oxide layer a second base layer having a plurality of voids over a plurality of the recessed portions;

polishing a surface of the second base layer;

forming a third base layer over the second base layer whose surface is polished;

forming a semiconductor element over the third base layer and crystallizing the metal oxide layer; and separating the second base layer with the first base layer at an intersecting surface with a plurality of the voids and a part of the crystallized metal oxide layer, thereby peeling off the semiconductor element from the substrate.

13. A method for peeling off a semiconductor element comprising:

forming over a first substrate a first base layer comprising a metal layer having a plurality of recessed portions and;

forming a metal oxide layer on a surface of the metal layer by oxidizing;

forming on the metal oxide layer a second base layer having a plurality of voids over a plurality of the recessed portions;

polishing a surface of the second base layer;

forming a third base layer over the second base layer whose surface is polished;

forming a semiconductor element over the third base layer and crystallizing the metal oxide layer;

forming a protective layer so as to cover the semiconductor element;

attaching a second substrate to the protective layer and attaching a third substrate to the first substrate; and separating the second base layer at an intersecting surface with a plurality of the voids and a part of the crystallized metal oxide layer, thereby peeling off the semiconductor element and the second substrate from the first substrate and the third substrate.

14. A method for peeling off a semiconductor element comprising:

forming over a first substrate a first base layer comprising a metal layer having a plurality of recessed portions and;

forming a metal oxide layer on a surface of the metal layer by oxidizing;

forming on the metal oxide layer a second base layer having a plurality of voids over a plurality of the recessed portions;

polishing a surface of the second base layer;

forming a third base layer over the second base layer whose surface is polished;

forming a semiconductor element over the third base layer and crystallizing the metal oxide layer;

forming a protective layer so as to cover the semiconductor element;

attaching a second substrate to the protective layer and attaching a third substrate to the first substrate; and separating the second base layer with the first base layer at an intersecting surface with a plurality of the voids and a part of the crystallized metal oxide layer, thereby peeling off the semiconductor element and the second substrate from the first substrate and the third substrate.

15. A method for manufacturing a semiconductor element comprising:

forming over a first substrate a first base layer having a plurality of recessed portions;

forming on the first base layer a second base layer having a plurality of voids over a plurality of the recessed portions;

forming a third base layer over the second base layer;

forming a semiconductor element over the third base layer;

separating the second base layer at an intersecting surface with a plurality of the voids, thereby peeling off the semiconductor element from the first substrate; and attaching the peeled semiconductor element to a second substrate.

16. A method for manufacturing a semiconductor element comprising:

forming over a first substrate a first base layer having a plurality of recessed portions;

forming on the first base layer a second base layer having a plurality of voids over a plurality of the recessed portions;

polishing a surface of the second base layer;

forming a third base layer over the second base layer whose surface is polished;

forming a semiconductor element over the third base layer;

separating the second base layer at an intersecting surface with a plurality of the voids, thereby peeling off the semiconductor element from the first substrate; and attaching the peeled semiconductor element to a second substrate.

17. A method for manufacturing a semiconductor element comprising:

forming over a first substrate a first base layer comprising a metal layer having a plurality of recessed portions and;

forming a metal oxide layer on a surface of the metal layer by oxidizing;

forming on the metal oxide layer a second base layer having a plurality of voids over a plurality of the recessed portions;

polishing a surface of the second base layer;

forming a third base layer over the second base layer whose surface is polished;

forming a semiconductor element over the third base layer and crystallizing the metal oxide layer;

separating the second base layer at an intersecting surface with a plurality of the voids and a part of the crystallized metal oxide layer, thereby peeling off the semiconductor element from the first substrate; and attaching the peeled semiconductor element to a second substrate.

18. A method for manufacturing a semiconductor element comprising:

forming over a first substrate a first base layer having a plurality of recessed portions;

forming on the first base layer a second base layer having a plurality of voids over a plurality of the recessed portions;

forming a third base layer over the second base layer;

forming a semiconductor element over the third base layer;

forming an opening portion which extends to a part of each of a plurality of the voids;

enlarging each of a plurality of the voids by diffusing an etchant into each of a plurality of the voids from the opening portion, and separating the second base layer at an intersecting surface with a plurality of the voids, thereby peeling off the semiconductor element from the first substrate; and attaching the peeled semiconductor element to a second substrate.

19. A method for manufacturing a semiconductor element comprising:

forming over a first substrate a first base layer having a plurality of recessed portions;

forming on the first base layer a second base layer having a plurality of voids over a plurality of the recessed portions;

polishing a surface of the second base layer;

forming a third base layer over the second base layer whose surface is polished;

forming a semiconductor element over the third base layer;

forming an opening portion which extends to a part of each of a plurality of the voids;

enlarging each of a plurality of the voids by diffusing an etchant into each of a plurality of the voids from the opening portion, and separating the second base layer at an intersecting surface with a plurality of the voids, thereby peeling off the semiconductor element from the first substrate; and attaching the peeled semiconductor element to a second substrate.

20. A method for peeling off a semiconductor element according to claim 1, wherein the first base layer is formed of an insulating layer.

21. A method for peeling off a semiconductor element according to claim 2, wherein the first base layer is formed of an insulating layer.

22. A method for peeling off a semiconductor element according to claim 3, wherein the first base layer is formed of an insulating layer.

23. A method for peeling off a semiconductor element according to claim 4, wherein the first base layer is formed of an insulating layer.

24. A method for peeling off a semiconductor element according to claim 5, wherein the first base layer is formed of an insulating layer.

25. A method for peeling off a semiconductor element according to claim 6, wherein the first base layer is formed of an insulating layer.

26. A method for peeling off a semiconductor element according to claim 7, wherein the first base layer is formed of an insulating layer.

27. A method for peeling off a semiconductor element according to claim 8, wherein the first base layer is formed of an insulating layer.

28. A method for peeling off a semiconductor element according to claim 9, wherein the first base layer is formed of an insulating layer.

29. A method for peeling off a semiconductor element according to claim 10, wherein the first base layer is formed of an insulating layer.

30. A method for peeling off a semiconductor element according to claim 3, wherein the polish is performed by CMP.

31. A method for peeling off a semiconductor element according to claim 4, wherein the polish is performed by CMP.

32. A method for peeling off a semiconductor element according to claim 5, wherein the polish is performed by CMP.

33. A method for peeling off a semiconductor element according to claim 6, wherein the polish is performed by CMP.

34. A method for peeling off a semiconductor element according to claim 7, wherein the polish is performed by CMP.

35. A method for peeling off a semiconductor element according to claim 8, wherein the polish is performed by CMP.

36. A method for peeling off a semiconductor element according to claim 9, wherein the polish is performed by CMP.

37. A method for peeling off a semiconductor element according to claim 10, wherein the polish is performed by CMP.

38. A method for peeling off a semiconductor element according to claim 11, wherein the polish is performed by CMP.

39. A method for peeling off a semiconductor element according to claim 12, wherein the polish is performed by CMP.

40. A method for peeling off a semiconductor element according to claim 13, wherein the polish is performed by CMP.

41. A method for peeling off a semiconductor element according to claim 14, wherein the polish is performed by CMP.

* * * * *